(12) United States Patent
Kurata et al.

(10) Patent No.: US 7,301,815 B2
(45) Date of Patent: Nov. 27, 2007

(54) SEMICONDUCTOR MEMORY DEVICE COMPRISING CONTROLLABLE THRESHOULD VOLTAGE DUMMY MEMORY CELLS

(75) Inventors: Hideaki Kurata, Kodaira (JP); Yoshihiro Ikeda, Takarazuka (JP); Masahiro Shimizu, Toyono (JP); Kenji Kozakai, Tachikawa (JP); Satoshi Noda, Ome (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/180,659

(22) Filed: Jul. 14, 2005

(65) Prior Publication Data

US 2006/0039230 A1    Feb. 23, 2006

(30) Foreign Application Priority Data

Aug. 23, 2004    (JP)    ............................. 2004-241991

(51) Int. Cl.
G11C 11/34    (2006.01)
(52) U.S. Cl. ............................. 365/185.2; 365/185.24; 365/210
(58) Field of Classification Search ........... 365/185.17, 365/185.2 O, 185.23, 185.24 X, 210 X, 185.24
See application file for complete search history.

(56) References Cited

U.S. PATENT DOCUMENTS

| | | | | |
|---|---|---|---|---|
| 4,086,662 A | * | 4/1978 | Itoh | ............................. 365/51 |
| 4,839,860 A | * | 6/1989 | Shinoda et al. | ............. 365/104 |
| 4,855,956 A | * | 8/1989 | Urai | ............................. 365/210 |
| 5,576,987 A | * | 11/1996 | Ihara et al. | .................. 365/149 |
| 6,188,608 B1 | * | 2/2001 | Maruyama et al. | ...... 365/185.2 |
| 6,920,079 B2 | * | 7/2005 | Shibayama | ............ 365/230.06 |
| 7,079,437 B2 | * | 7/2006 | Hazama et al. | ............. 365/210 |
| 7,239,556 B2 | * | 7/2007 | Abe et al. | ............... 365/185.33 |
| 2003/0155607 A1 | | 8/2003 | Kamigaki et al. | |

FOREIGN PATENT DOCUMENTS

JP    2001-156275    3/2000

OTHER PUBLICATIONS

Kobayashi, T., "A Giga-Scale Assist-Gate (AG)-AND-Type Flash Memory Cell with 20-MB/s Programming Throughput for Content-Downloading Applications", IEEE, 2001, pp. 1-4.
Arai, F., "High-Density ($4.4F^2$) NAND Flash Technology Using Super-Shallow Channel Profile (SSCP) Engineering", IEEE, 2000, pp. 1-4.
Sasago, Y., "90-nm-node multi-level AG-AND type flash memory with cell size of true 2 $F^2$/bit and programming throughput of 10 MB/s", IEEE, 2003, 1-4.

\* cited by examiner

*Primary Examiner*—VanThu Nguyen
(74) *Attorney, Agent, or Firm*—Reed Smith LLP; Stanley P. Fisher, Esq.; Juan Carlos A. Marquez, Esq.

(57) ABSTRACT

The present invention provides a semiconductor memory device capable of preventing a defect caused by falling of a word line and deterioration in patterning precision due to disturbance of the pitch of word lines at an end of a memory block. Plural dummy word lines are disposed at an end of a memory block and a word driver is mounted for the dummy word line to control the threshold voltage of a dummy memory cell formed below the dummy word line. Also at the time of operating a memory area for storing data from the outside, a bias is applied to the dummy word line. The invention can prevent a defect caused by falling of a word line and deterioration in patterning precision due to disturbance of the pitches of word lines at an end of a memory block, and realize high yield and reliable operation.

21 Claims, 31 Drawing Sheets

SEMICONDUCTOR MEMORY DEVICE COMPRISING CONTROLLABLE THRESHOULD VOLTAGE DUMMY MEMORY CELLS

CLAIM OF PRIORITY

The present application claims priority from Japanese application JP 2004-241991 filed on Aug. 23, 2004, the content of which is hereby incorporated by reference into this application.

BACKGROUND OF THE INVENTION

The present invention relates to a nonvolatile semiconductor memory device (EEPROM) constructed by a plurality of electrically programmable and erasable memory cells and, more particularly, to a semiconductor memory device such as an NAND cell type EEPROM, an AND cell type EEPROM, a DINOR cell type EEPROM, and a NOR cell type EEPROM.

As a kind of a semiconductor memory device, there is an EEPROM (Electrically Erasable Programmable Read-Only Memory). Particularly, an AND cell type EEPROM in which plural memory cells are connected in parallel described in, for example, T. Kobayashi et al, IEEE International Electron Devices Meeting", 2001, pp. 29-32 is known as an EEPROM realizing high integration. A memory cell in the AND cell type EEPROM has an FETMOS structure in which a floating gate (charge trapping layer) and a control gate are stacked via an insulator film on a semiconductor substrate. Plural memory cells are connected in parallel so as to share sources and drains and are connected as a unit to a data line. Such AND cells are arranged in a matrix, thereby forming a memory cell array. Since the plural memory cells are connected in a lump to the data line, it is unnecessary to mount a contact between the data line and the memory cells for each of the memory cells, so that a highly-integrated memory cell array can be realized.

First, the configuration of a memory array in the AND cell type EEPROM will be described in detail. FIG. 2 is a diagram showing the configuration of a block in a memory cell array and a word decoder in the AND cell type EEPROM. An area MB indicated by broken line in FIG. 2 shows an AND cell group called a memory block sharing the same word line and a gate signal of a select transistor. A local drain line LBD in each memory block is connected to a data line extending in plural memory blocks via a select transistor STRD. A local source line LBS in each memory block is connected to a common source line CS via the select transistor STRS. To each of the blocks, a gate signal STD of the select transistor connected to the data line, a gate signal STS of the select transistor connected to the common source line, and memory cell word line signals WL0 to WLm are connected. By the gate signals STD and STS supplied according to a row address and a word line voltage supplied from the word decoder in accordance with the row address, the memory block MB and a row of the AND cell are selected. The word decoder is constructed in an inverter type in which a word driver is mounted for each word line and, for example, a PMOS and an NMOS are connected in series. A power supply VP on the high voltage side is connected to the source of the PMOS side of the word driver, and a power supply VN on the low voltage side is connected to the source on the NMOS side. As input signals of the word driver, word line selection signals SG0 to SGm are connected.

The operation of such an AND cell type EEPROM is performed as follows. Date is written by applying a positive high voltage, for example, 18V to a word line of a selected memory cell and applying a voltage of 0V or about 5V to a data line in accordance with data to be written. When 0V is applied to the data line, the potential reaches the channel of the memory cell via the select transistor STRD and the local drain line LBD. Electrons are injected from the channel to a floating gate of the selected memory cell by Fowler-Nordheim tunneling current. This state corresponds to "0". On the other hand, when 5V is applied to the data line, the potential similarly reaches the channel of the selected memory cell and acts to reduce the electric field between a control gate and the channel. As a result, electrons are not injected into the floating gate of the selected memory cell. This state corresponds to "1".

Data is erased on the word line unit basis by applying a negative high voltage to the word line of the selected memory cell. In this case, electrons are ejected from the floating gate toward the substrate by Fowler-Nordheim tunneling current. As a result, the threshold voltage of the selected memory cell shifts to the negative direction and the state corresponding to "1" is obtained.

Data is read by using a phenomenon that current flowing between the source and the drain changes according to the state of the threshold voltage of a memory cell. When the word line of a selected memory cell is set to a read level and current flows, an erase state of "1" is determined. When no current flows, "0" is determined.

In such a memory cell array, plural word lines are arranged at regular intervals in each of the memory blocks, so that the word lines are regularly arranged with regular line widths and spaces in the center of the memory block. On the other hand, in a portion around the border of memory blocks, for example, in an area upper than a word line WL0 or lower than a word line Wm, regularity of wiring arrangement is disturbed. It causes a problem such that patterning of the word lines of, for example, WL0 or WLm at both ends of a memory block is unstable, that is, patterning precision is lower as compared with that of word lines of, for example, WL1 to WLm-1 in the center of the memory block, in which regularity of the wiring arrangement is maintained. Such disturbance of regular intervals becomes more conspicuous as reduction of the memory cell size progresses. For example, as photolithography technique realizing microfabrication of 0.1 µm process or finer, phase shift lithography, particularly, Levenson phase shift lithography is known. In the Levenson phase shift lithography, phases of neighboring patterns have to be inverted. To realize high resolution, it is important to improve the regularity. At the same time, it is indispensable that phases of a light source as an illumination system are aligned. In the case of using a light source having aligned phases, if the regular intervals of the patterns are disturbed, the width of, particularly, the second word line from the end of the memory block tends to decrease due to a change in a development area in the border between rough and fine word line patterns and an optical factor. Although the dimensions can be set to the same from the viewpoint of light intensities, due to variations in the degree of sharpness, that is, contrast of a profile of light intensity, development progress speed varies. When a narrow wordline is formed for the above reasons, coupling between a control gate and a floating gate varies, and there is the possibility that the memory cell characteristics such as write and erase characteristics may be largely varied. Further, when a word line having a very small width is formed, there is the possibility that the word line falls and is short-circuited with a neighboring word line or the gate line of a select transistor, and a defect occurs. Such a problem may similarly occurs in the memories disclosed in JP-A No. 2001-156275 and Y. Sasago et al, "IEEE International Electron Devices Meeting", 2003, pp. 952-955.

Further, such a problem may similarly occur not only in an AND cell type EEPROM but also in an NAND cell type EEPROM disclosed by, for example, F. Arai et al, "IEEE International Electron Devices Meeting", 2000, pp. 775-778. FIG. 3 is a diagram showing the configuration of a block in a memory cell array and a word decoder in the NAND cell type EEPROM. An area MB indicated by broken line in FIG. 3 shows an NAND cell group called a memory block sharing the same word line and a gate signal of a select transistor. A local bit line LB in each memory block is connected to a data line extending in plural memory blocks via a select transistor STRD. A local bit line LB in each memory block is connected to a common source line CS via the select transistor STRS.

One memory cell in the NAND cell type EEPROM is similar to that in the AND cell type EEPROM with respect to the point that it has an FETMOS structure in which a floating gate (charge trapping layer) and a control gate are stacked on a semiconductor substrate via an insulator film. Different from the AND cell type EEPROM in which plural memory cells are connected in parallel so as to share sources and drains, the NAND cell type EEPROM is characterized in that plural memory cells are connected in series. Such AND cells are arranged in a matrix, thereby constructing a memory cell array. Since the plural memory cells connected in series are connected in a lump to a data line as described above, it is unnecessary to dispose a contact between the data line and a memory cell for each of the memory cells, and the high-integrated memory cell array can be realized. To each of the blocks, a gate signal STD of a select transistor connected to the data line, a gate signal STS of the select transistor connected to a common source line, and memory cell word line signals WL0 to WLm are connected. By the gate signals STD and STS supplied according to a row address and a word line voltage supplied from the word decoder in accordance with the row address, the memory block MB and a row of the AND cell are selected.

In such a memory cell array of the NAND cell type EEPROM, plural word lines are arranged at regular intervals in each of the memory blocks, so that the word lines are regularly arranged with regular line widths and spaces in the center of the memory block. On the other hand, in a portion around the border of memory blocks, for example, in an area upper than a word line WL0 or lower than a word line Wm, regularity of wiring arrangement is disturbed. It causes a problem such that patterning of the word lines of, for example, WL0 and WLm at both ends of a memory block is unstable, that is, patterning precision is lower as compared with that of word lines of, for example, WL1 to WLm-1 in the center of the memory block, in which regularity of the wiring arrangement is maintained. The NAND cell type EEPROM has the same problem as that of the AND cell EEPROM with respect to the point that the disturbance of regular intervals becomes more conspicuous as reduction of the memory cell size progresses. Therefore, like the AND cell type EEPROM, the NAND cell type EEPROM has a problem of reduction in the word line width and falling of the word line in an end of each memory block.

In a conventional semiconductor memory device such as an AND cell type EEPROM, the programming precision of a word line disposed close to a gate signal of a select transistor in a memory block is lower than that of the other word lines, and there is the possibility that the word line is formed narrower than designed. In this case, characteristics of writing, erasing, and the like of memory cells are largely different from those of memory cells of other word lines, and an operation error may occur. When the line width is decreased severely, there is the possibility that a word line falls and is short-circuited with a neighboring word line or a gate signal of a select transistor, thereby causing a defect.

The present invention has been achieved in view of the circumstances and an object of the invention is to provide a reliable semiconductor memory device capable of preventing a defect which occurs due to reduction in the word line width and falling of a word line caused by disturbance in regularity of the intervals of word line patterns near a select transistor in a memory block.

SUMMARY OF THE INVENTION

According to an aspect of the present invention, a semiconductor memory device includes: a memory block in which memory cell units obtained by connecting plural memory cells are arranged in an array; at least one dummy word line adjacent to a select transistor in the memory cell units in a memory cell array constructed by disposing plural memory blocks; and a word driver for controlling dummy word line potential in one of the dummy word lines.

In the semiconductor memory device according to the invention, preferably, three dummy word lines adjacent to the select transistor are provided at each of both ends of the memory cell unit, and a word driver for controlling the dummy word line potential of at least one dummy word line is disposed in a word decoder.

In the semiconductor memory device according to the invention, preferably, a control signal of a word driver for controlling the dummy word line potential is commonly used as a control signal of a word driver for controlling another dummy word line potential.

Further, in the semiconductor memory device according to the invention, a word driver for controlling the dummy word line potential may simultaneously control another dummy word line potential.

In the semiconductor memory device according to the invention, a word driver for controlling the dummy word line potential has the same configuration as that of a word driver for controlling a word line of a data storage area.

In the semiconductor memory device according to the invention, width of a dummy word line disposed on the outermost side of the memory cell unit is set to be wider than that of other dummy word lines.

In the semiconductor memory device according to the invention, in the memory cell unit, plural nonvolatile memory cells are connected in parallel.

In the semiconductor memory device according to the invention, the memory cell may use an inversion layer as a bit line in the memory cell unit.

The semiconductor memory device according to the invention may further include means which controls a threshold voltage so that a dummy memory cell formed just below the dummy word line becomes nonconductive.

In the semiconductor memory device according to the invention, the memory cell unit is an NAND type EEPROM in which plural nonvolatile memory cells are connected in series.

The semiconductor memory device according to the invention may further include means which controls a threshold voltage so that a dummy memory cell formed just below the dummy word line becomes conductive.

According to another aspect of the invention, a semiconductor memory device includes: a memory block in which memory cell units obtained by connecting plural memory cells are arranged in an array; two dummy word lines adjacent to a select transistor at each of both ends of the memory cell unit in a memory cell array constructed by disposing plural memory blocks; and a word driver for controlling dummy word line potential in each of the dummy word lines, the word driver being provided in a word decoder.

In the semiconductor memory device according to the invention, a control signal of a word driver for controlling the dummy word line potential may be commonly used as a control signal of a word driver for controlling another dummy word line potential.

In the semiconductor memory device according to the invention, a word driver for controlling the dummy word line potential may simultaneously control another dummy word line potential.

In the semiconductor memory device according to the invention, a word driver for controlling the dummy word line potential may have the same configuration as that of a word driver for controlling a word line of a data storage area.

In the semiconductor memory device according to the invention, width of a dummy word line disposed on the outermost side of the memory cell unit may be set to be wider than that of other dummy word lines.

In the semiconductor memory device according to the invention, in the memory cell unit, plural nonvolatile memory cells are connected in parallel.

In the semiconductor memory device according to the invention, the memory cell may use an inversion layer as a bit line in the memory cell unit.

The semiconductor memory device according to the invention may further include means which controls a threshold voltage so that a dummy memory cell formed just below the dummy word line becomes nonconductive.

In the semiconductor memory device according to the invention, the memory cell unit is an NAND type EEPROM in which plural nonvolatile memory cells are connected in series.

The semiconductor memory device according to the invention may further include means which controls a threshold voltage so that a dummy memory cell formed just below the dummy word line becomes conductive.

Thus, the present invention can achieve a semiconductor memory device capable of suppressing a defect caused by reduction in width of a word line and falling of a word line which occurs due to disturbance in regularity of intervals of word line patterns near a select transistor in each of memory blocks in a memory cell array having a hierarchical bit line structure, and realizing a chip having improved yield and high reliability.

DETAILED DESCRIPTION OF THE PREFERRED EMBODIMENTS

Embodiments of the present invention will be described hereinbelow with reference to the drawings.

First Embodiment

Figure 1:
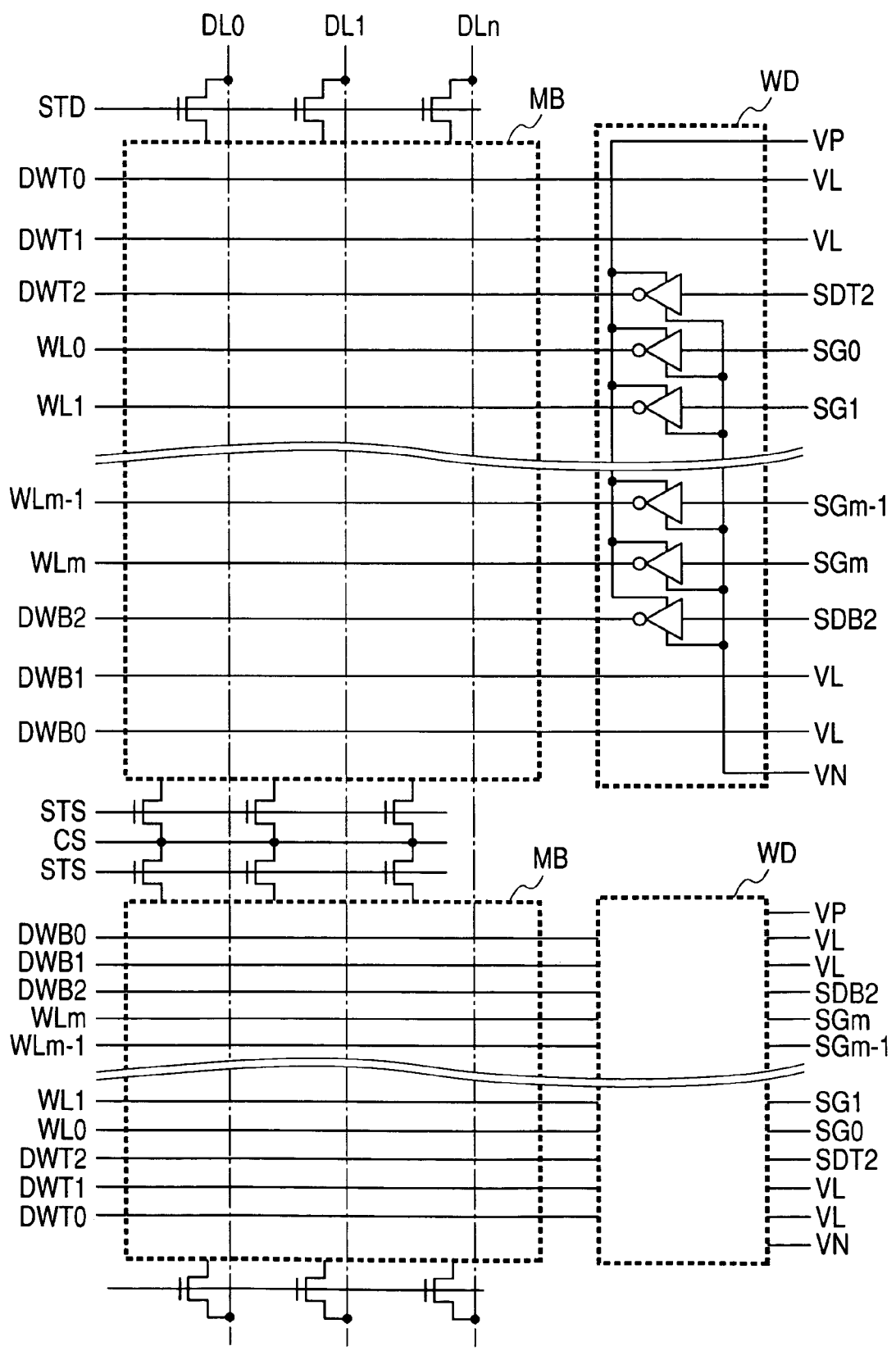
FIG. 1 is a diagram showing the configuration of a memory block and a word decoder in a semiconductor memory device of a fourth embodiment of the invention.
Figure 2:
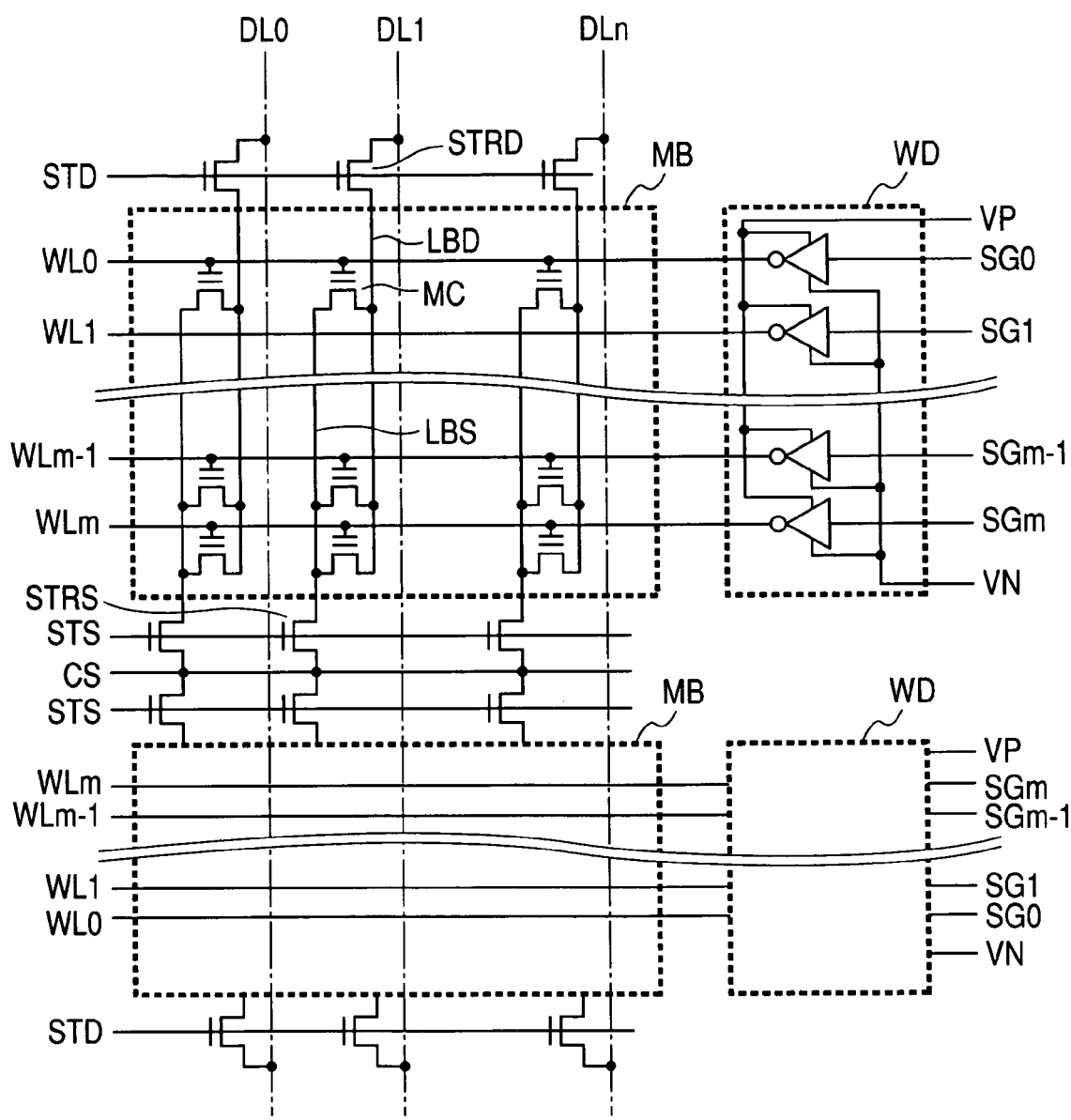
FIG. 2 is a diagram showing the configuration of a memory block and a word decoder in a conventional AND cell type EEPROM.
Figure 3:
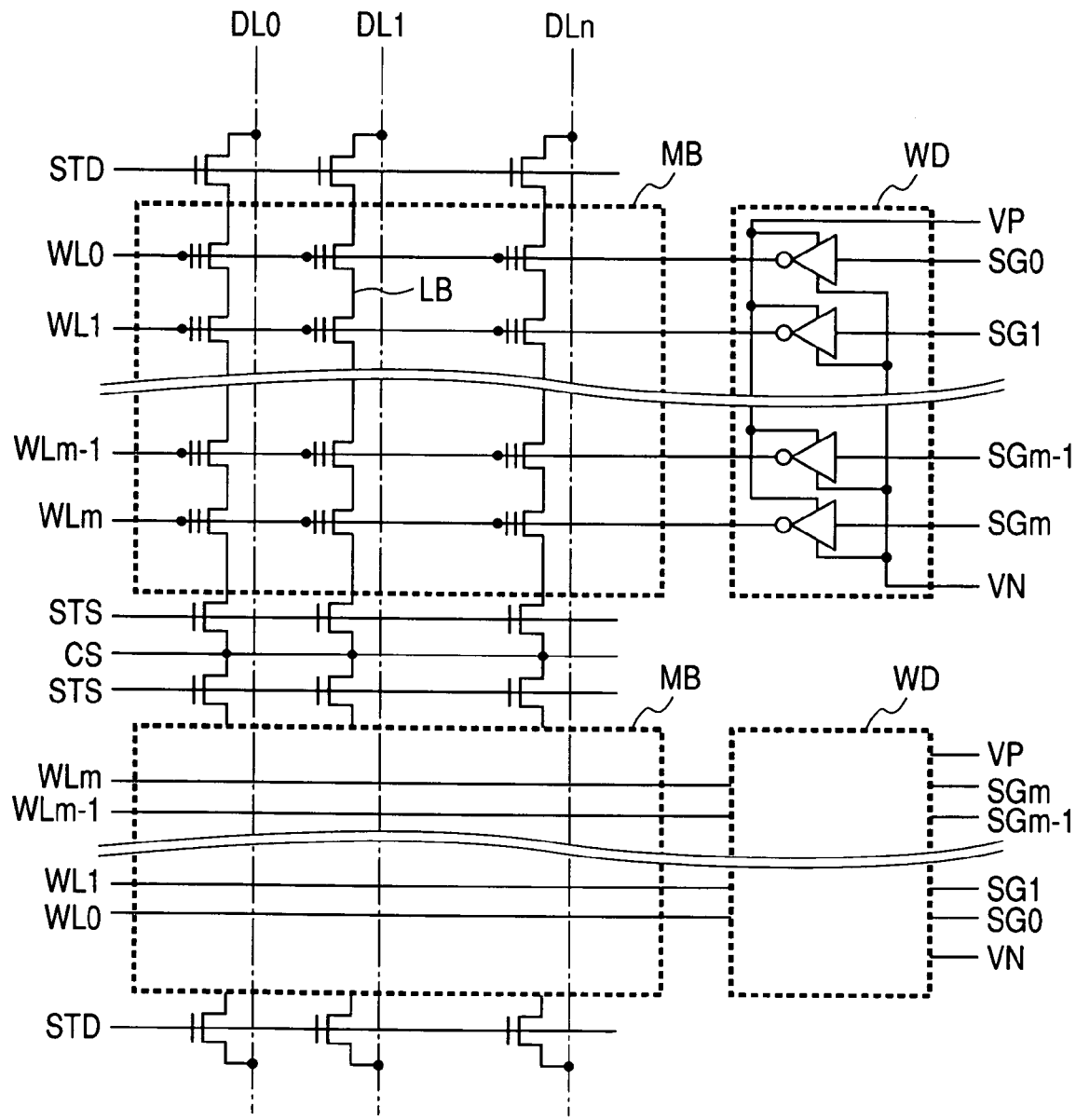
FIG. 3 is a diagram showing the configuration of a memory block and a word decoder in a conventional NAND cell type EEPROM.
Figure 4:
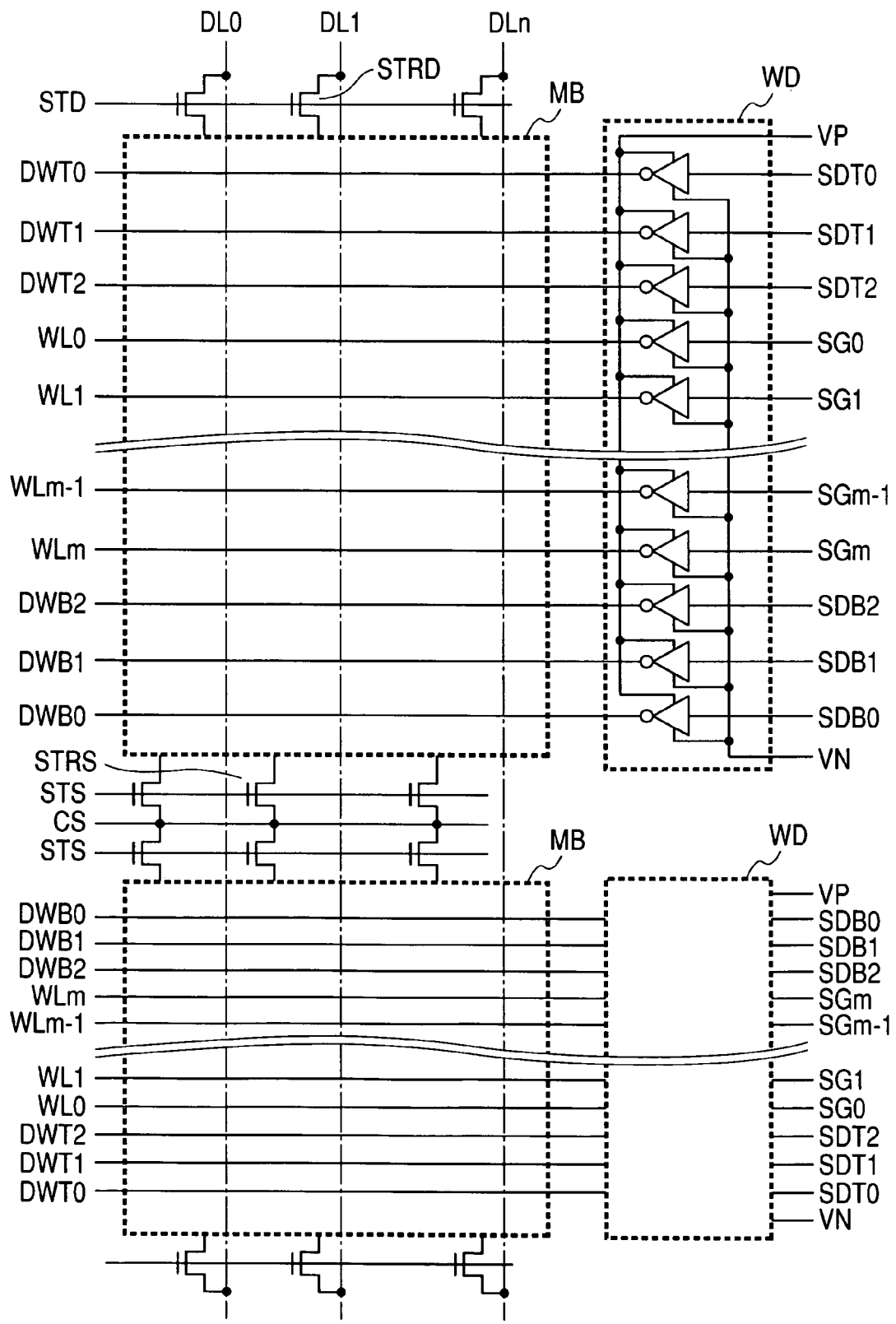
FIG. 4 is a diagram showing the configuration of a memory block and a word decoder in a semiconductor memory device according to a first embodiment of the invention.
Figure 5:
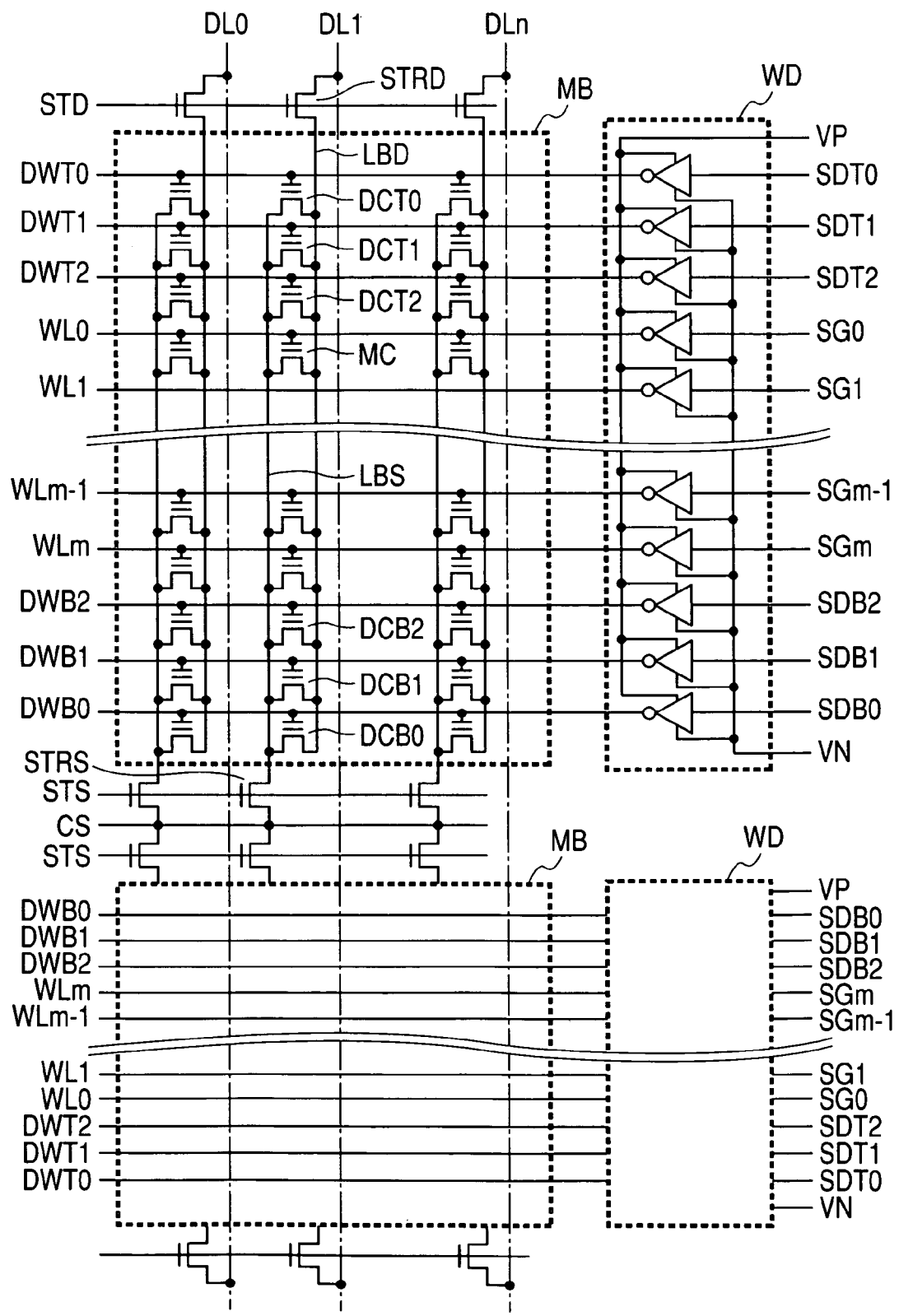
FIG. 5 is a diagram showing the configuration of a memory block and a word decoder in the semiconductor memory device according to the first embodiment of the invention, in the case where the memory block is constructed by the AND cell type EEPROM.
Figure 6:
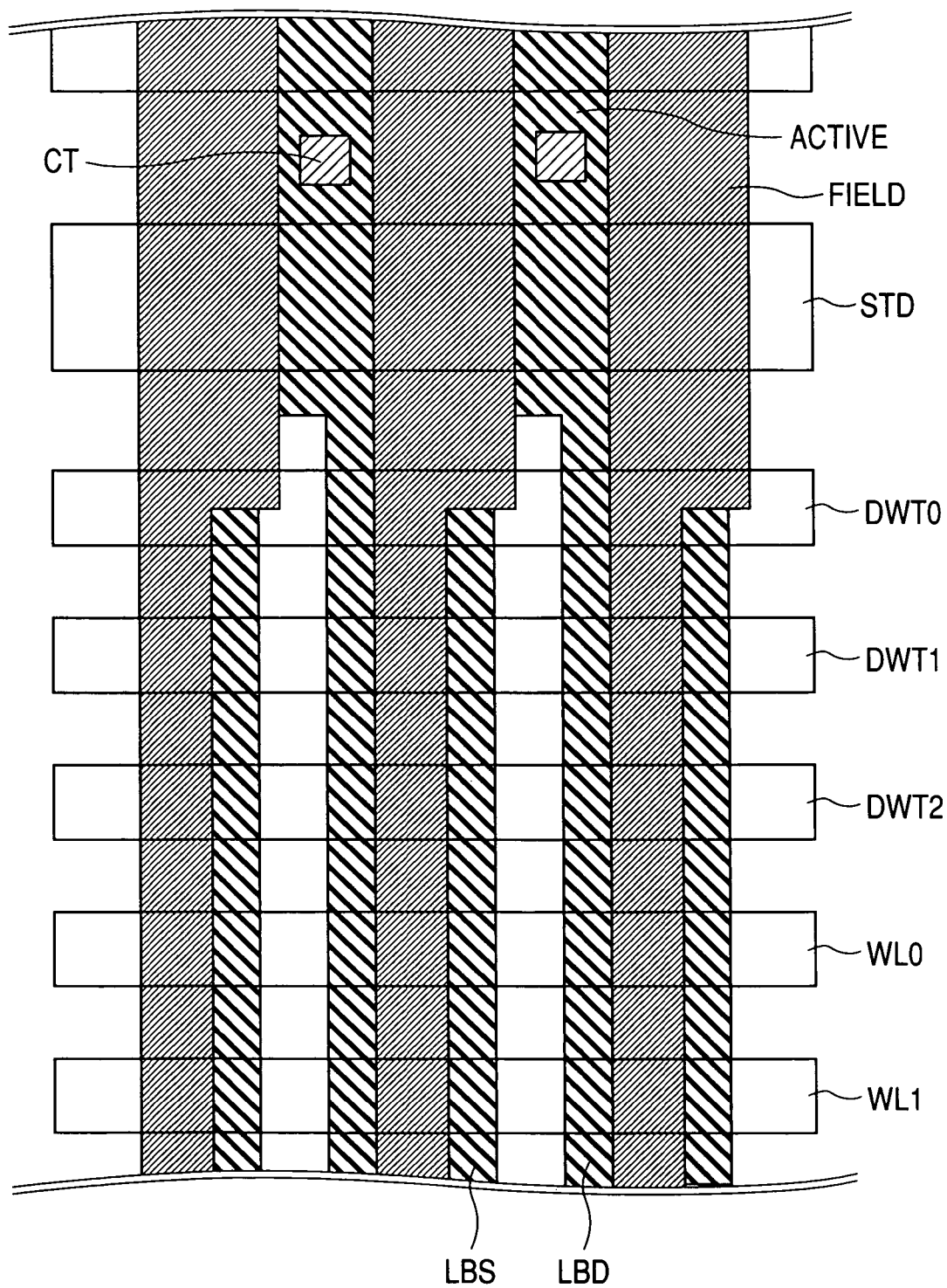
FIG. 6 is a top view of a memory block end in the semiconductor memory device according to the first embodiment of the invention.

FIG. 4 illustrates a semiconductor memory device according to a first embodiment of the invention. A memory cell array shown in FIG. 4 has a hierarchical bit line structure. A memory block MB in the diagram may be of the AND cell type or the NAND cell type. The memory block MB is different from a conventional AND type or NAND type memory block is with respect to the point that dummy word lines DWT0 to DWT2 and DWB0 to DWB2 are provided on the outside of word lines WL0 to WLm. There is the possibility that the patterning precision of a word line pattern disposed at an end of the memory block deteriorates and, particularly, the width of the second word line from the end decreases. Consequently, by disposing dummy word lines on the outside of the word lines in the memory block as shown in FIG. 1, word lines in a memory cell part (hereinbelow, memory cell body) in which external data is actually stored (hereinbelow, memory cell body) can be patterned with high precision. By disposing three dummy word lines on each of the outer sides of the word lines, for example, even if the second dummy word lines DWT1 and DWBL from the ends are broken due to reduction in width, short-circuit occurs in any of the dummy word lines DWT0, DWT2, DWB0, and DWB2. Short-circuit does not occur in the word lines in the memory cell part for actually storing external data, so that no defect occurs. The embodiment is characterized in that word drivers similar to the word lines (WL0 to WLm) are disposed for the dummy word lines (DWT0 to DWT2 and DWB0 to DWB2). An embodiment of the AND cell type memory array will be concretely described hereinbelow with reference to FIG. 5. FIG. 5 shows the case where the memory block MB actually has an AND type memory array configuration and the other configuration is the same as that of FIG. 4. When attention is paid to, for example, the memory cell MC, dummy memory cells DCT0 to DC2 and DCB0 to DCB2 formed below the dummy word lines are connected in parallel with the local drain lines. In a manner similar to the memory cell MC, the dummy memory cells have an FETMOS structure having a floating gate. FIG. 6 is a top view of a portion of connection to the data lines in the embodiment. The dummy word lines DWT0 to DWT2 are disposed between the select transistor gate signal line STD and the word line WL0. A contact CT is disposed on a gate line of the select transistor on the side opposite to the memory array and is connected to the data line. Memory cells in the direction perpendicular to the word line are electrically isolated by an insulating area FIELD formed by STI (Shallow Trench Isolation) or the like. Diffusion layer lines LBS and LBD for forming sources and drains of the memory cells in the AND cell type EEPROM extend in the direction perpendicular to the word lines. Although not shown in the diagram, a floating gate is formed under the word line and between the local source line LBS and the local drain line LBD. In FIG. 6, the floating gates and the sources and drains are formed not only under the word lines (WL0 and WL1) but also the dummy word lines DWT0 to DWT2, thereby forming the memory cells.

It is known that, in a flash memory, a phenomenon in which a floating gate is charged up, that is, the floating gate is charged positively or negatively occurs in a manufacturing process, particularly, an etching process or the like. In the case where the floating gate is charged up positively in any of, for example, the memory cells DCT0 to DCT2 and DCB0 to DCB2 under the dummy word lines, if the dummy word lines can be set only to a fixed voltage, for example, 0V, there is the possibility that the dummy memory cells DCT0 to DCT2 and DCB0 to DCB2 are made conductive. In the case of the array configuration in which cells are arranged in parallel such as the AND cell type memory cell array, if the dummy cells are always conductive, the main memory cells cannot be read normally.

Figure 7:
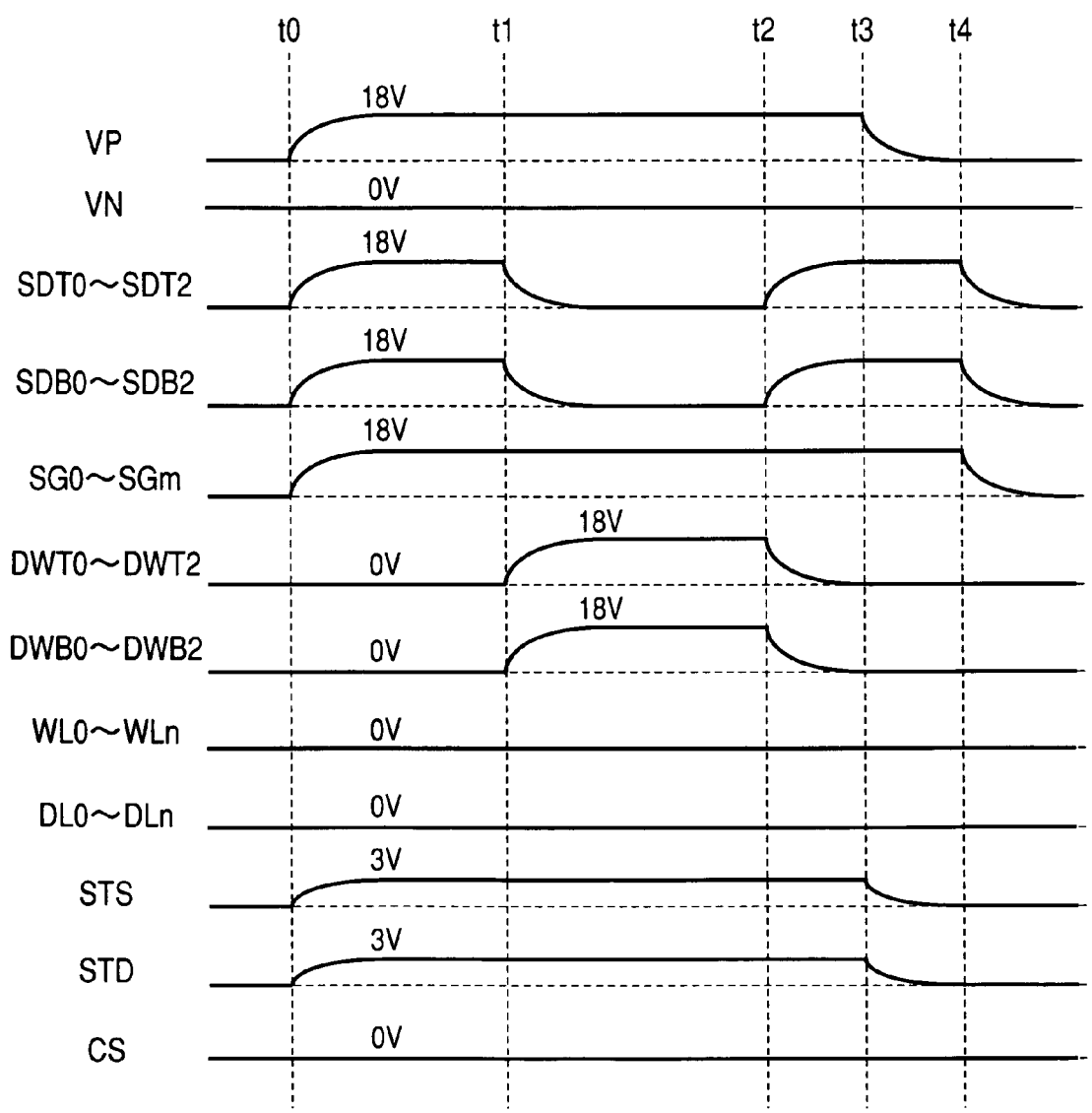
FIG. 7 is a timing chart showing a method of controlling a dummy word in the semiconductor memory device according to the first embodiment of the invention.

When the word drivers are disposed also for the dummy word lines in a manner similar to those for the word lines and the threshold voltages in the dummy memory cells DCT0 to DCT2 and DCB0 to DCB2 can be controlled, even if the dummy memory cells are charged positively, the threshold voltage can be reset to a proper threshold voltage at the time of testing a product. The method will be described hereinbelow with reference to FIGS. 5 and 7. FIG. 7 shows an example of operation timings in a test.

At the time of conducting a test before shipment of products, first, at timing t0, for example, the supply voltage VP to the word decoder WD is set to 18V, and the power supply VN is set to 0V. Simultaneously, the dummy word line selection signals SDT0 to SDT2 and SDB0 to SDB2 and the word line selection signals SG0 to SGm are set to high voltage of 18V. The data lines DL0 to DLn are set to 0V, and the select transistor gate signals STD and STS are set to about 3V. Next, when the dummy word line selection signals SDT0 to SDT2 and SDB0 to SDB2 are set to 0V at the timing t1, the dummy word lines DWT0 to DWT2 and DWB0 to DWB2 are connected to the power supply VP on the high voltage side of the word decoder WD, and high voltage of 18V is applied. On the other hand, the word line selection signals SG0 to SGm remain at 18V. Since the word lines WL0 to WLm are connected to the power supply VN on the low voltage side of the word decoder WD, 0V is applied. Since 0V is applied to the channels of the dummy memory cells DCT0 to DCT2 and DCB0 to DCB2 via the select transistor from the data lines DL0 to DLn, Fowler-Nordheim tunneling current flows by high voltage between the control gate, that is, the dummy word line and the channel, electrons are ejected to the floating gates of the dummy memory cells DCT0 to DCT2 and DCB0 to DCB2, and the threshold voltage increases. Since only 0V is applied to the word lines of the memory cells, the ejection of electrons does not occur. After a bias is applied for predetermined time, at timing t2, the dummy word selection signals SDT0 to SDT2 and SDB0 to SDB2 are set to 18V. The dummy word line is connected to the power supply VN on the low-voltage side of the word driver WD and becomes 0V, so that ejection of electrons to the dummy memory cells DCT0 to DCT2 and DCB0 to DCB2 is stopped. At timing t3, the power supply VP on the high voltage side of the word driver WD is decreased to 0V. At timing t4, the dummy word line selection signals SDT0 to SDT2 and SDB0 to SDB2 are set to 0V, thereby completing the series of operations. Even if the dummy memory cells DCT0 to DCT2 and DCB0 to DCB2 under the dummy word lines are positively charged in the manufacture process, by the above-described operation, electrons are injected to the floating gates of the dummy memory cells DCT0 to DCT2 and DCB0 to DCB2, the threshold voltages of the dummy memory cells DCT0 to DCT2 and DCB0 to DCB2 are shifted to the higher direction, and a malfunction does not occur in the memory cells after shipment of the product. Further, by checking whether the threshold voltage is proper or not on the dummy word line unit basis, occurrence of the malfunction can be checked more reliably. In the case where it is known as a result of checking the threshold voltage on the dummy word line unit basis that the threshold voltage does not reach a proper voltage, by additionally performing the electron ejecting operation shown in FIG. 7 on the dummy word line, the threshold voltage can be set to a proper voltage.

Further, at the time of reading the memory cells, by setting the dummy word lines to 0V or a negative voltage of about −2V, leak current in the dummy memory cells is suppressed, and erroneous reading can be prevented.

Figure 8:
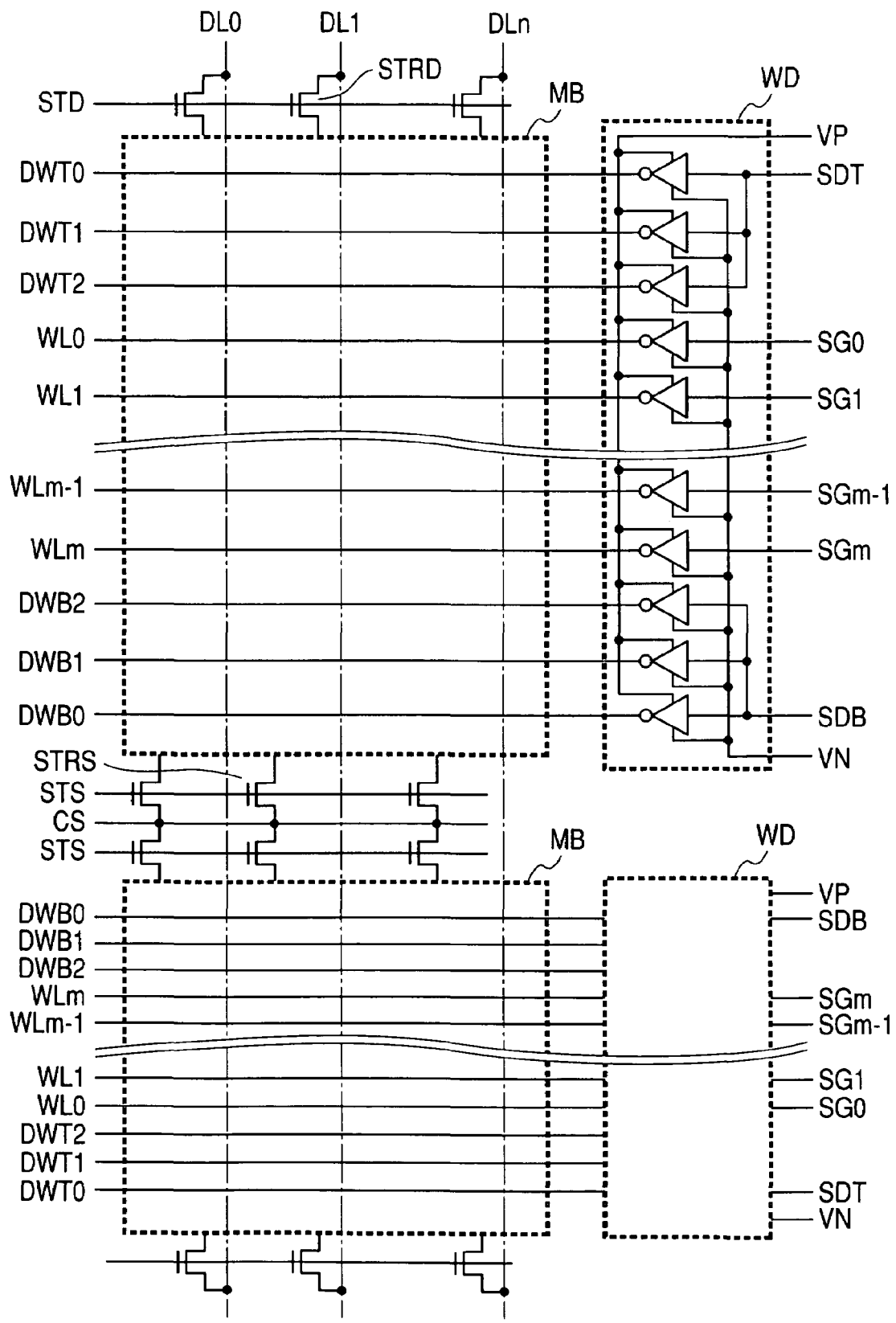
FIG. 8 is a diagram showing the configuration of a memory block and a word decoder in the semiconductor memory device according to the first embodiment of the invention, in which the configuration of the word decoder is different from that of FIG. 4.

In FIG. 7, the dummy word line selection signals SDT0 to SDT2 and SDB0 to SDB2 are simultaneously controlled, and the bias is applied simultaneously to the dummy word lines DWT0 to DWT2 and DWB0 to DWB2. Alternately, as shown in FIG. 8, the dummy word line selection signals SDT0 to SDT2m and SDB0 to SDB2 may be driven as common lines SDT and SDB. By using the lines SDT and SDB as common lines, an effect capable of reducing the number of signals generated by a logic circuit is produced.

Figure 9:
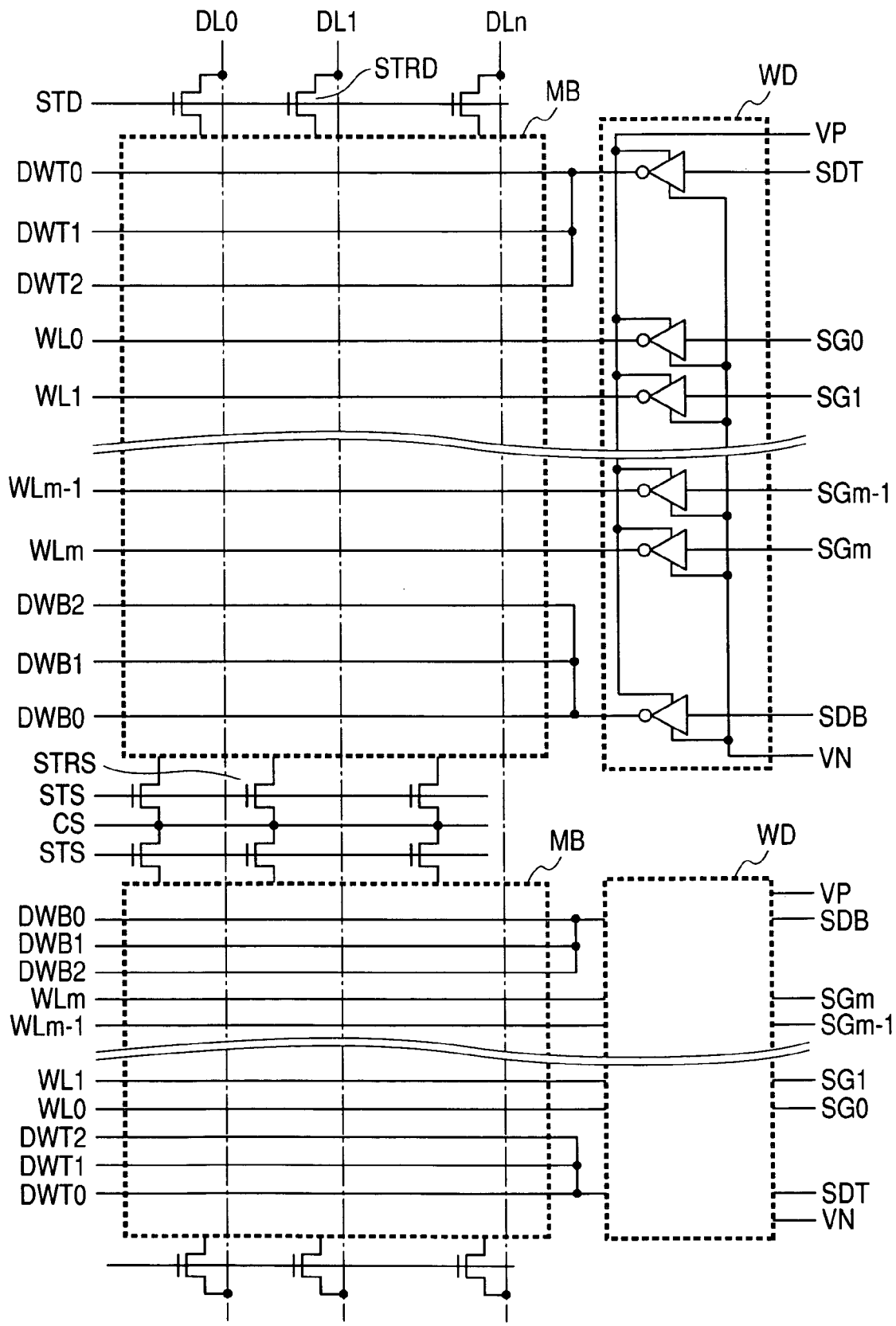
FIG. 9 is a diagram showing the configuration of the memory block and the word decoder in the semiconductor memory device according to the first embodiment of the invention, in which the configuration of the word decoder is different from that of FIG. 4 and that of FIG. 8.

As shown in FIG. 9, for example, three dummy word lines may be controlled by one word driver. Since the load on the word driver increases by three times, it takes time to activate and deactivate the dummy word lines, and test time becomes slightly longer. However, the number of word drivers per memory block MB can be reduced, and the layout area of the word decoder WD can be reduced.

Although the inverter type has been described as an example of the configuration of the word driver in the embodiment, another configuration such as a configuration using a transfer NMOS may be also used.

Second Embodiment

A second embodiment of the present invention will be described with reference to FIG. 10.

Figure 10:
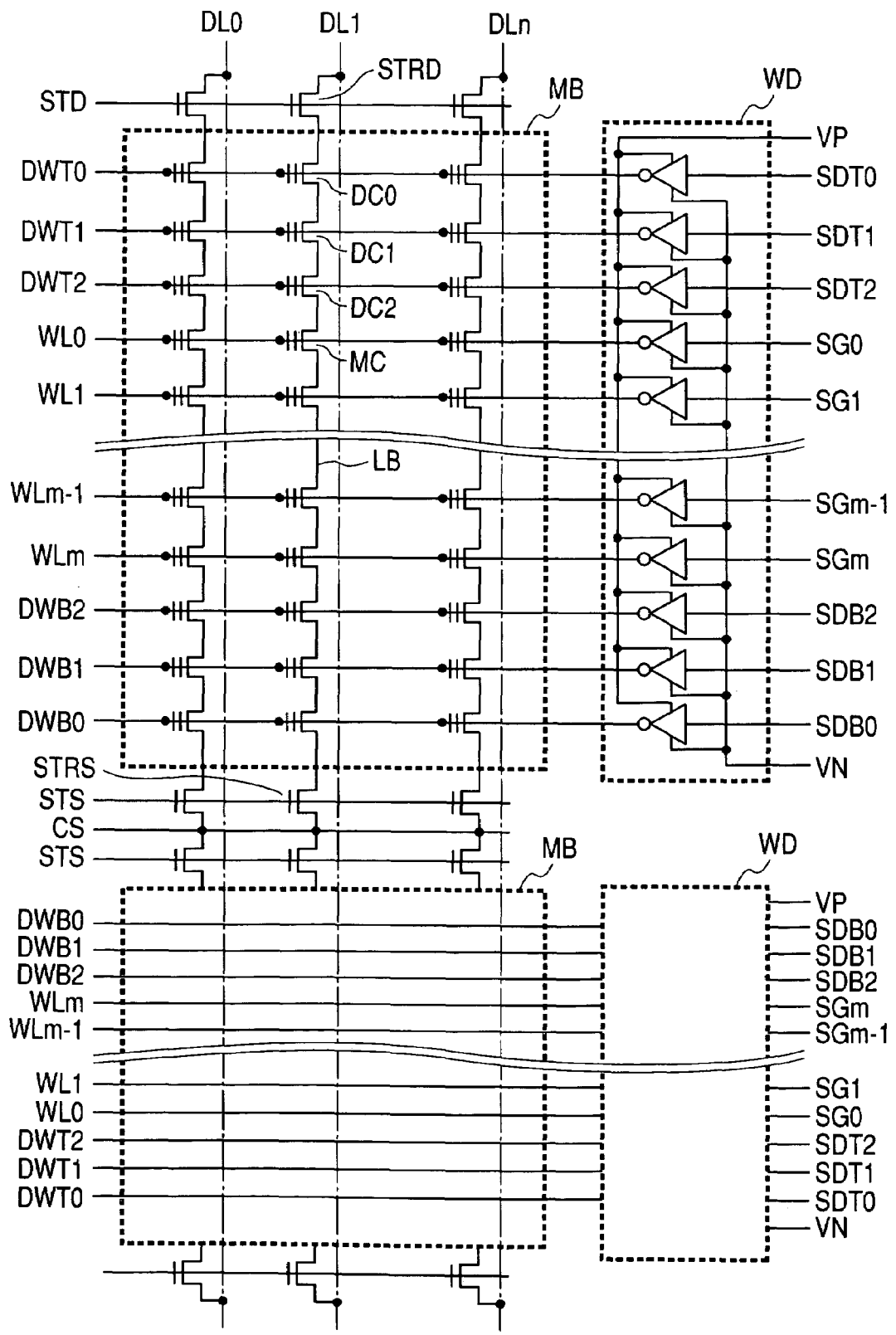
FIG. 10 is a diagram showing the configuration of a memory block and a word decoder in a semiconductor memory device according to a second embodiment of the invention.

FIG. 10 is the same as FIG. 5 except that the memory cells in the memory block MB are NAND cells connected in series. The memory block is different from a conventional NAND cell type memory block with respect to the point that the dummy word lines DWT0 to DWT2 and DWB0 to DWB2 are provided on the outside of the word lines WL0 to WLm. Since there is the possibility that patterning precision of a word line pattern disposed at an end of a memory block decreases and, particularly, the second word line from the end is narrowed, if dummy word lines are disposed on the outer sides of the word lines in the memory block as shown in FIG. 10, word lines (hereinbleow, called main word lines) in the memory cell part (hereinbelow, main memory cells) for actually storing external data can be patterned with high precision. By disposing three dummy word lines on each of the outer sides of the word lines, for example, even if the second dummy word lines DWT1 and DWB1 from the ends are broken due to reduction in width, short-circuit occurs in any of the dummy word lines DWT0, DWT2, DWB0, and DWB2. Short-circuit does not occur in the word lines in the memory cell part for actually storing external data, so that no defect occurs. The embodiment is characterized in that word drivers similar to the main word lines (WL0 to WLm) are disposed for the dummy word lines (DWT0 to DWT2 and DWB0 to DWB2).

When attention is paid to, for example, the memory cell MC, dummy memory cells DCT0 to DC2 and DCB0 to DCB2 formed below the dummy word lines are connected to the same local bit line LB. In a manner similar to the memory cell MC, the dummy memory cells have an FET-MOS structure having a floating gate. It is known that, in a flash memory, a phenomenon in which a floating gate is charged up, that is, the floating gate is charged positively or negatively occurs in a manufacturing process, particularly, an etching process or the like. In the case where the floating gate is charged up negatively in even one of, for example, the memory cells DCT0 to DCT2 and DCB0 to DCB2 under the dummy word lines, if the dummy word lines can be set only to a fixed voltage such as 0V, there is the possibility that the dummy memory cells DCT0 to DCT2 and DCB0 to DCB2 are made nonconductive. In the case of the array configuration in which cells are arranged in series like the NAND cell type memory cell array, if the dummy cells are always nonconductive, the main memory cells cannot be read normally.

Figure 11:
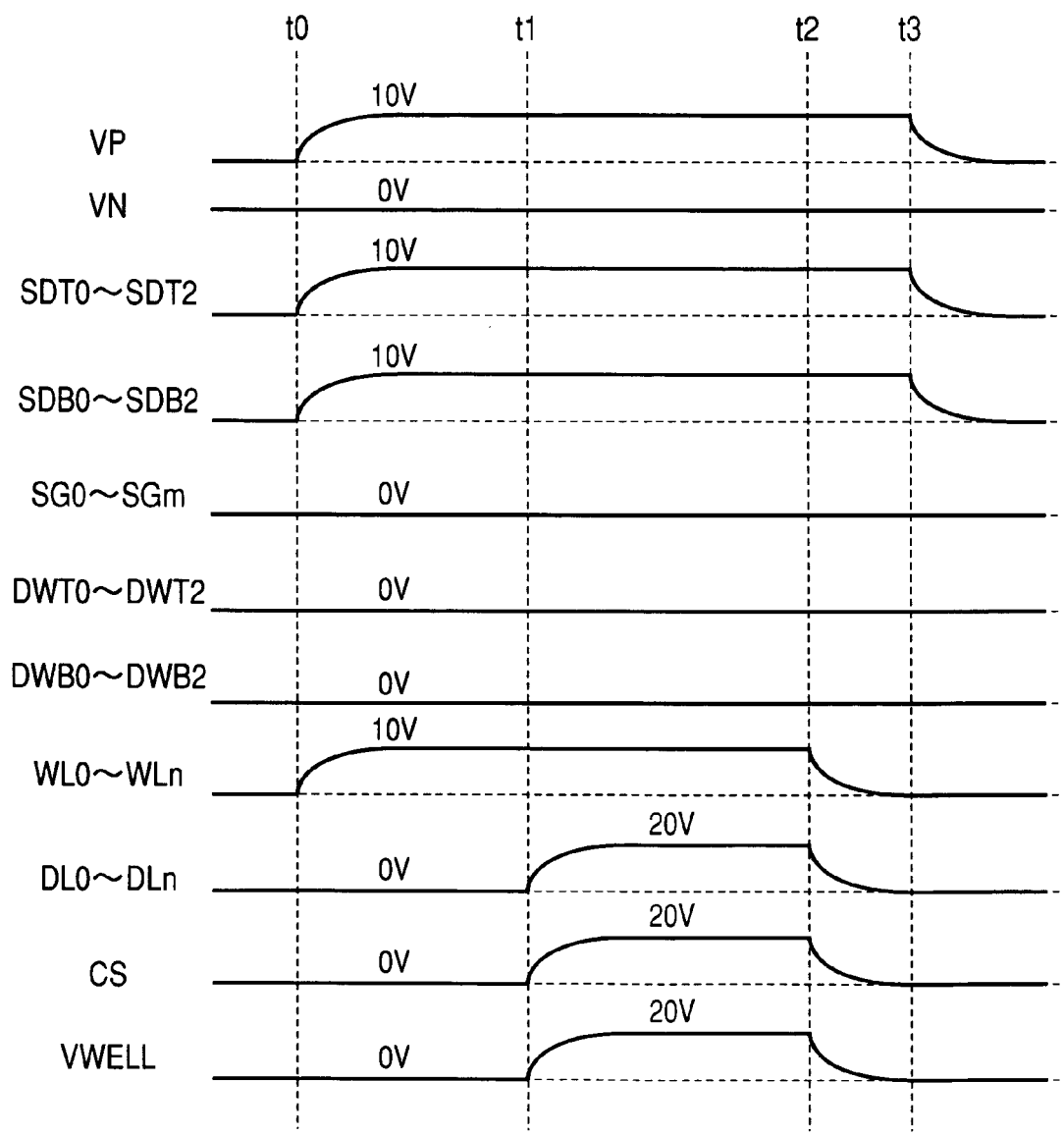
FIG. 11 is a timing chart showing a method of controlling a dummy word in the semiconductor memory device according to the second embodiment of the invention.

When the word drivers are disposed also for the dummy word lines in a manner similar to those for the main word lines and the threshold voltages in the dummy memory cells DCT0 to DCT2 and DCB0 to DCB2 can be controlled, even if the dummy memory cells are charged largely negatively, the threshold voltage can be reset to a proper threshold voltage at the time of testing a product. The method will be described hereinbelow with reference to FIGS. 10 and 11. FIG. 11 shows an example of operation timings in a test.

At the time of conducting a test before shipment of products, first, at timing t0, for example, the supply voltage VP of the word decoder WD is set to 10V, and the power supply VN is set to 0V. Simultaneously, the dummy word line selection signals SDT0 to SDT2 and SDB0 to SDB2 are set to high voltage of 10V. 0V is applied from the power supply VN on the low voltage side of the word driver to the dummy word lines DWT0 to DWT2 and DWB0 to DWB2. The main word line selection signals SG0 to SGm are set to 0V, and 10V is supplied from the power supply VP on the high voltage side of the word decoder to the main word lines WL0 to WLm. At timing t1, high voltage of 20V is applied to the data lines DL0 to DLn, the common source line CS, and a well VWELL of the memory. In the dummy memory cells DCT0 to DCT2 and DCB0 to DCB2, 20V is applied to the substrate and 0V is applied to the control gate, so that electrons are removed to the substrate side and the threshold voltage decreases. On the other hand, 10V is applied to the word lines of the body memory cells, so that the electric field is not lessened and the electrons are not removed from the floating gate to the substrate. After a bias is applied for predetermined time, at timing t2, the data lines DL0 to DLn, the common source line CS, and the well VWELL of the memory are set to 0V, thereby stopping removal of electrons from the floating gates of the dummy memory cells DCT0 to DCT2 and DCB0 to DCB2. At timing t3, the power supply VP of the word decoder WD is set to 0V and the dummy word line selection signals SDT0 to SDT2 and SDB0 to SDB2 are set to 0V, thereby completing the series of operations.

Even if the dummy memory cells DCT0 to DCT2 and DCB0 to DCB2 under the dummy word lines are largely positively charged in the manufacture process, by the above-described operation, electrons are ejected from the floating gates of the dummy memory cells DCT0 to DCT2 and DCB0 to DCB2, the threshold voltages of the dummy memory cells DCT0 to DCT2 and DCB0 to DCB2 are shifted to the lower direction, and a malfunction does not occur in the main memory cells after shipment of the product. Further, by checking whether the threshold voltage is proper or not on the dummy word line unit basis, occurrence of a malfunction can be checked more reliably. In the case where it is known as a result of checking the threshold voltage on the dummy word line unit basis that the threshold voltage does not reach a proper voltage, by additionally performing the electron ejecting operation shown in FIG. 11 on the dummy word line, the threshold voltage can be set to a proper voltage. Although the threshold voltages of only the dummy memory cells DCT0 to DCT2 and DCB0 to DCB2 formed under the dummy word lines DWT0 to DWT2 and DWB0 to DWB2 are shifted in the lower direction in FIG. 11, by controlling the main word line selection signals SG0 to SGm in a manner similar to the dummy word line selection signals, the threshold voltages of the main memory cells may be shifted to the lower direction.

Further, at the time of reading the main memory cells, by setting the dummy word lines to a positive voltage of about 5V like other word lines which are not selected, the dummy memory cells are made conductive with reliability, and erroneous reading can be prevented.

At the time of erasing the main memory cell, a control may be performed so as to prevent over erasure by applying the same voltage as that applied to the word line of a not-selected memory block, for example, about 10V to the dummy word lines disposed for the not-selected memory block.

In FIG. 11, the dummy word line selection signals SDT0 to SDT2 and SDB0 to SDB2 are simultaneously controlled, and the bias is applied simultaneously to the dummy word lines DWT0 to DWT2 and DWB0 to DWB2. Alternately, as shown in FIG. 8, the dummy word line selection signals SDT0 to SDT2m and SDB0 to SDB2 may be driven as common lines SDT and SDB. In such a manner, an effect capable of reducing the number of signals generated by a logic circuit is produced. Moreover, by using SDT and SDB as common lines, the effect can be increased. As shown in FIG. 9, for example, three dummy word lines may be controlled by one word driver. Since the load on the word driver increases by three times as compared with that for the main word lines, it takes time to activate and deactivate the dummy word lines, and test time becomes slightly longer. However, the number of word drivers per memory block MB can be reduced, and the layout area of the word decoder WD can be reduced.

Although the inverter type has been described as an example of the configuration of the word driver in the embodiment, another configuration such as a configuration using a transfer NMOS may be also used.

Third Embodiment

Figure 12:
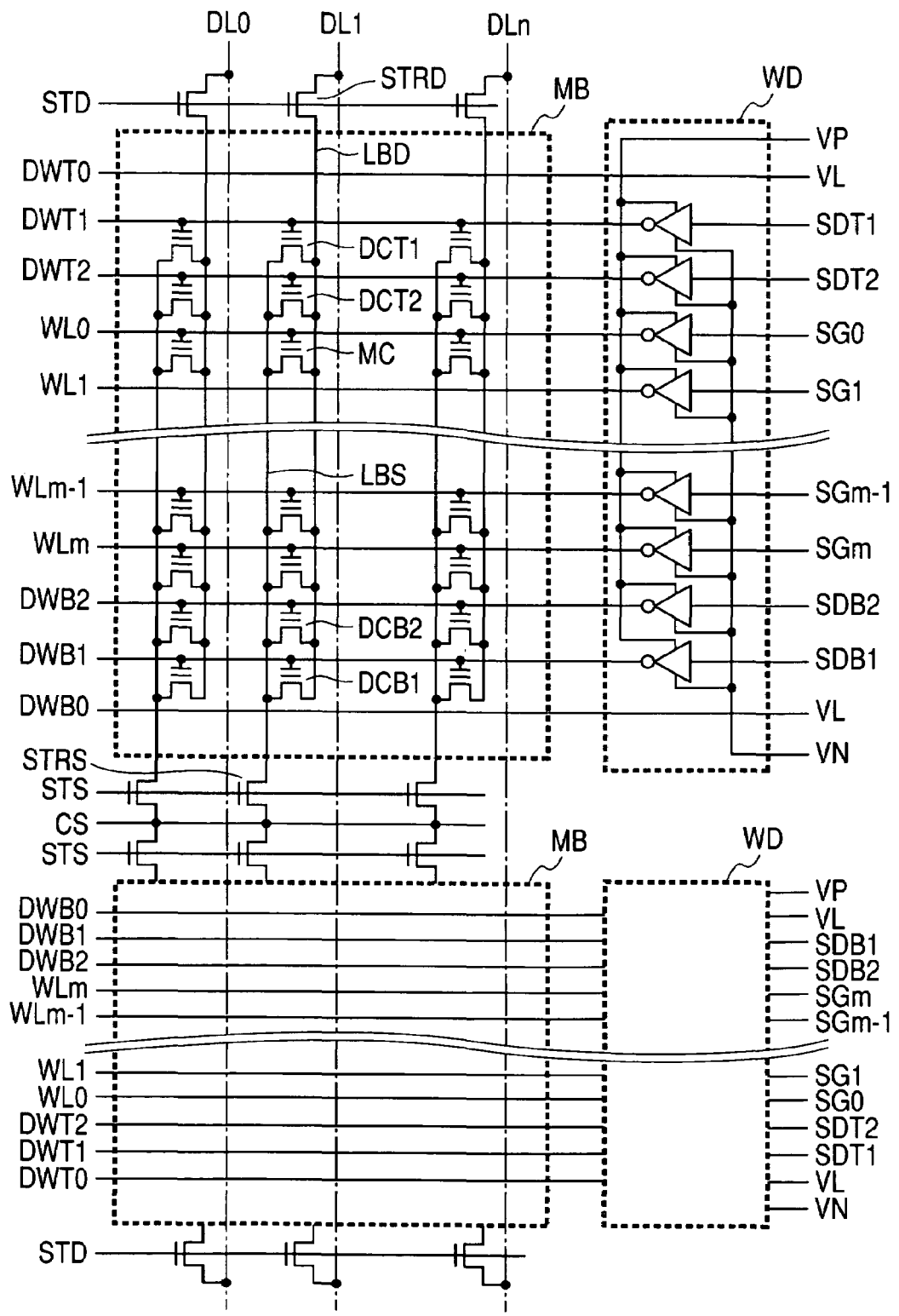
FIG. 12 is a diagram showing the configuration of a memory block and a word decoder in a semiconductor memory device according to a third embodiment of the invention.
Figure 13:
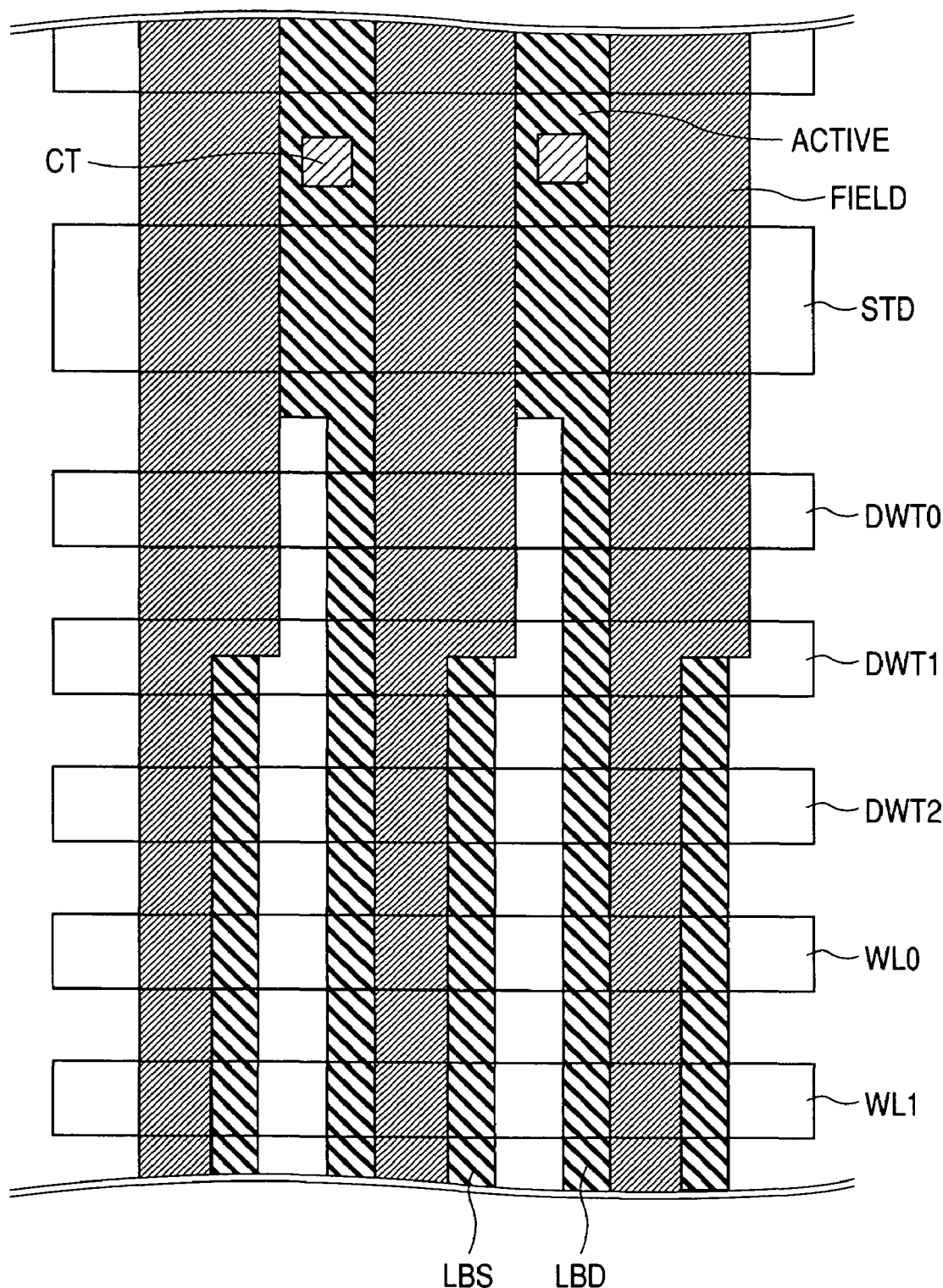
FIG. 13 is a top view of a memory block end in the semiconductor memory device according to the third embodiment of the invention.

A third embodiment of the present invention will be described with reference to FIGS. 12 and 13. In the first embodiment of the present invention, the case where memory cells are formed under the dummy word lines likewise under the main word lines has been described. In the third embodiment, the case where memory cells are not formed under the dummy word lines will be described in detail. FIG. 13 is a top view of a portion of connection to the data lines in the embodiment. The dummy word lines DWT0 to DWT2 are disposed between the select transistor gate signal line STD and the main word line WL0. By disposing three dummy word lines on each of the outer sides of the word lines, for example, even if the second dummy word lines DWT1 and DWB1 from the ends are broken due to reduction in width, short-circuit occurs in any of the dummy word lines DWT0, DWT2, DWB0, and DWB2. Short-circuit does not occur in the word lines in the memory cell part for actually storing external data, so that no defect occurs. FIG. 13 is different from FIG. 6 with respect to the point that the local source line is cut under the dummy word line DWT1 by the insulating area FIELD formed by STI or the like. With the configuration, a state in which the local source line does not exist under the dummy word line DWT0 and the memory cell does not function as a memory cell is obtained. Therefore, no memory cell exists under the dummy word line DWT0, and an equivalent circuit of the memory block is as shown in FIG. 12. Although FIG. 13 illustrates that no memory cell is formed under the dummy word line DWT0 closest to a select transistor in the portion of connection to the data line, by using a layout similar to that of FIG. 13 also for a portion of connection to the common source line, it becomes possible not to form a memory cell under the dummy word line DWB0 closest to the select transistor. In such a manner, without controlling the dummy word lines DWT0 and DWB0, no influence is exerted on the main memory. Therefore, the word drivers for controlling the dummy word lines DWT0 and DWB0 become unnecessary. Therefore, the number of word drivers which have to be disposed in the word decoder WD can be reduced, and the layout area of the word decoder can be reduced. The dummy word lines DWT0 and DWB0 may be of a floating type. It is sufficient to apply a fixed voltage VL, for example, 0V to the dummy word lines DWT0 and DWB0.

FIG. 13 illustrates the case where the local source line LBS is cut under the dummy word line DWT1 by the insulating area FIELD formed of STI or the like. The case where the local source line LBS is cut between the dummy word lines DWT1 and DWT0 is similar to the case of FIG. 13.

Figure 14:
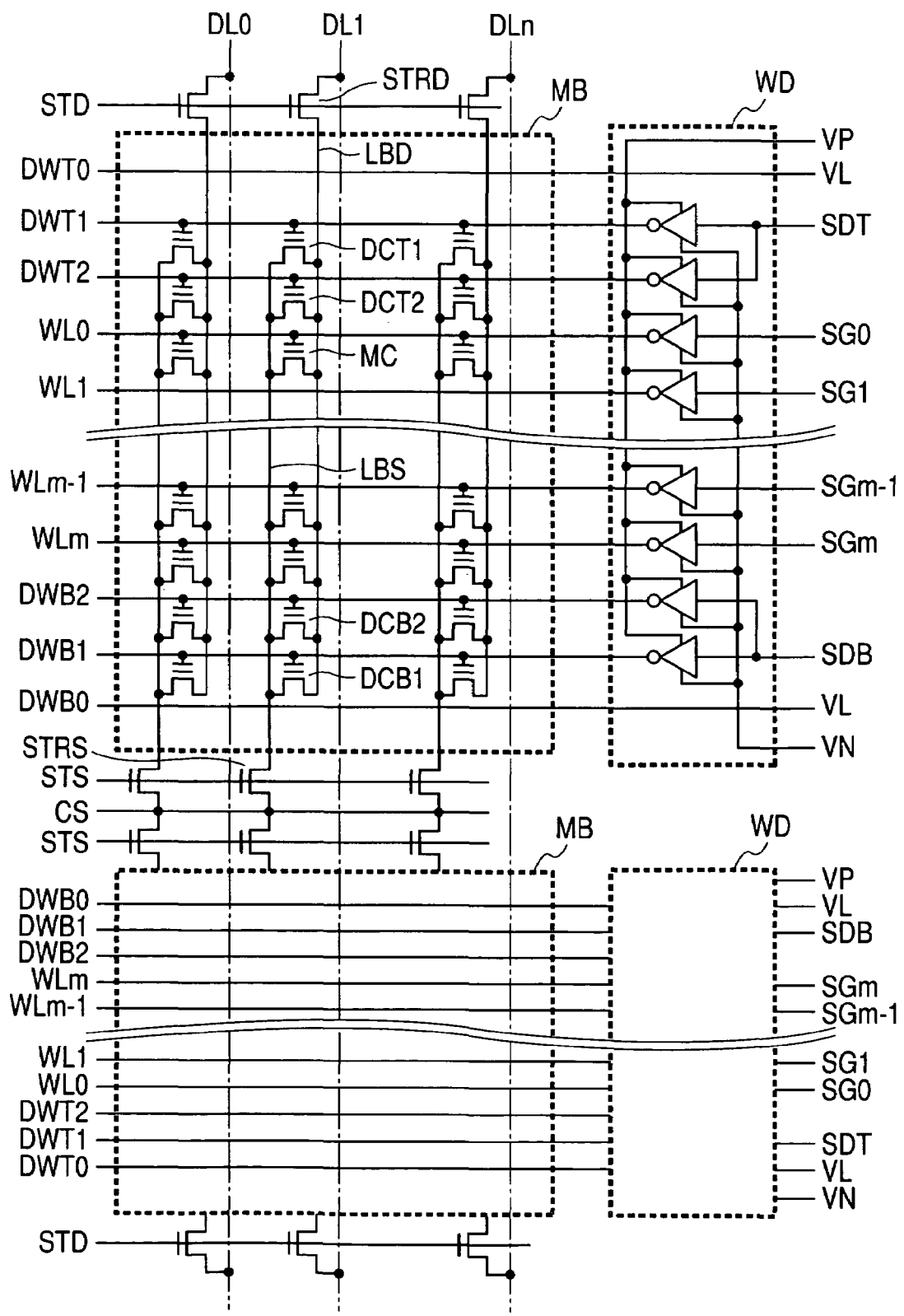
FIG. 14 is a diagram showing the configuration of a memory block and a word decoder in the semiconductor memory device according to the third embodiment of the invention, in which the configuration of the word decoder is different from that of FIG. 12.

In FIG. 12, a driver is provided for each of the dummy word lines DWT1, DWT2, DWB1, and DWB2 in which dummy memory cells are formed. Alternately, as shown in FIG. 14, the dummy word line selection signals SDT1, SDT2, STB1, and SDB2 in FIG. 12 may be controlled as common signals SDT and SDB. In this case, an effect capable of reducing the number of signals to be generated by the logic circuit is produced. Further, when SDT and SDB are commonly used, the effect increases.

Figure 15:
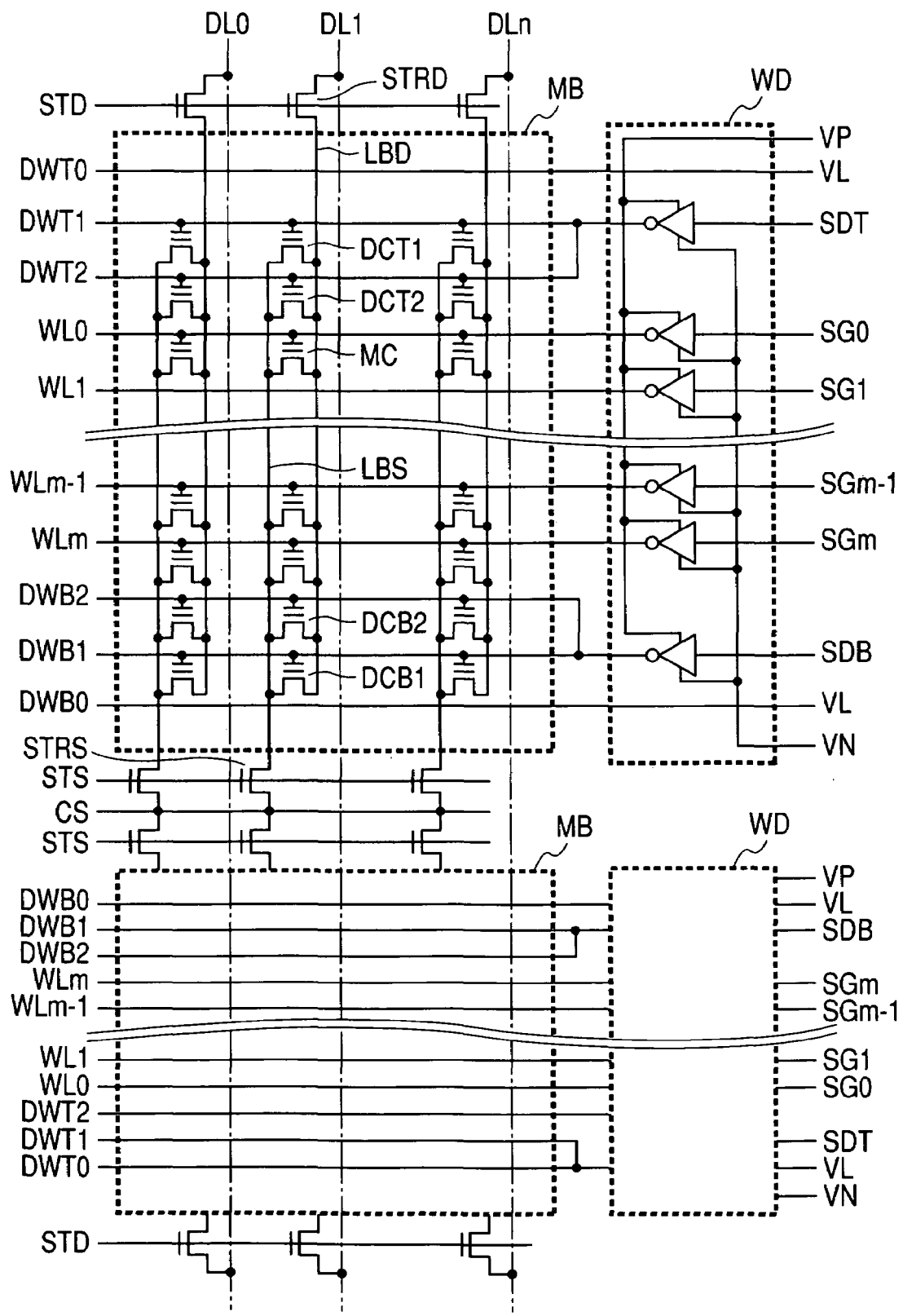
FIG. 15 is a diagram showing the configuration of a memory block and a word decoder in the semiconductor memory device according to the first embodiment of the invention, in which the configuration of the word decoder is different from that of FIG. 12 and that of FIG. 14.

As shown in FIG. 15, for example, each of the dummy word lines DWT1, DWT2, DWB1, and DWB2 may be controlled by a single word driver. As compared with the main word line, the load on the word driver doubles, it takes time to activate and deactivate the dummy word lines, and test time becomes slightly longer. However, the number of word drivers per memory block MB can be reduced, and the layout area of the word decoder WD can be reduced.

Although the inverter type has been described as an example of the configuration of the word driver in the embodiment, another configuration such as a configuration using a transfer NMOS may be also used.

Fourth Embodiment

Figure 16:
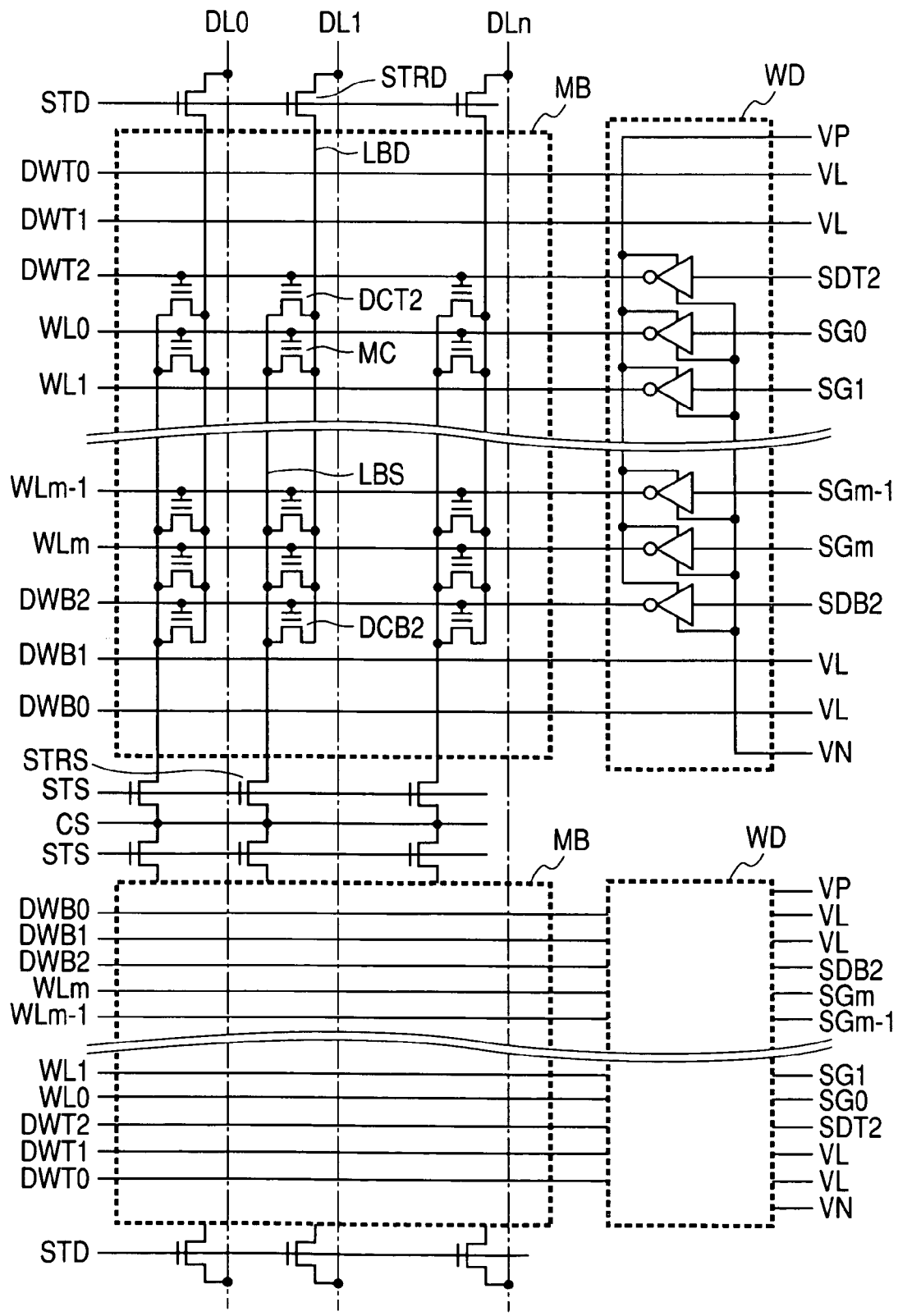
FIG. 16 is a diagram showing the configuration of a memory block and a word decoder in a semiconductor memory device according to a fourth embodiment of the invention, in which a memory block is constructed by an AND type EEPROM.

A fourth embodiment of the present invention will be described with reference to FIGS. 1, 16, and 17.

Figure 17:
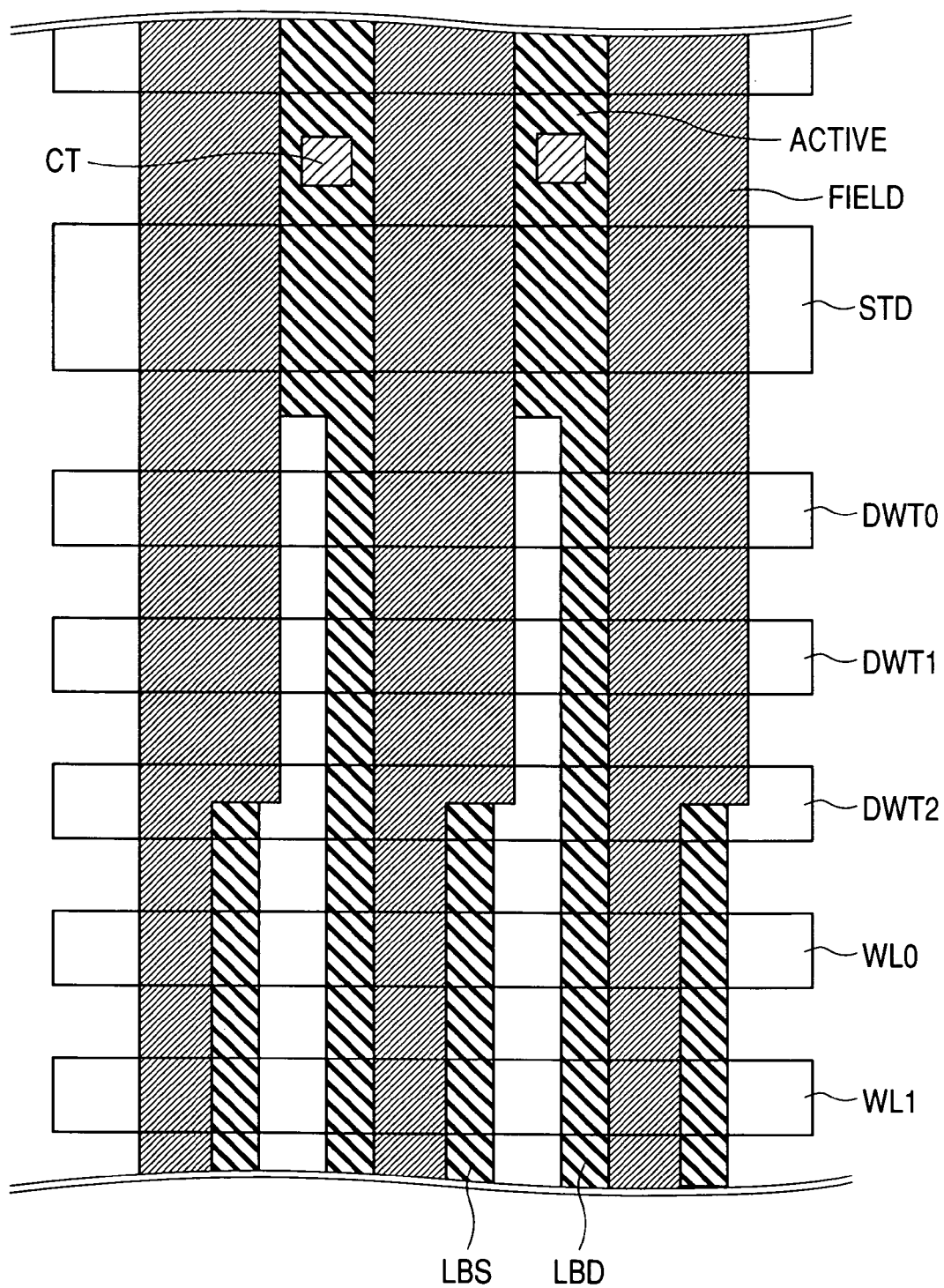
FIG. 17 is a top view of a memory block end in the semiconductor memory device according to the fourth embodiment of the invention.

FIG. 17 is a top view of a portion of connection to the data lines in the embodiment. The dummy word lines DWT0 to DWT2 are disposed between the select transistor gate signal line STD and the main word line WL0. By disposing three dummy word lines on each of the outer sides of the word lines, for example, even if the second dummy word lines DWT1 and DWB1 from the ends are broken due to reduction in width, short-circuit occurs in any of the dummy word lines DWT0, DWT2, DWB0, and DWB2. Short-circuit does not occur in the word lines in the memory cell part for actually storing external data, so that no defect occurs. FIG. 17 is different from FIG. 13 of the third embodiment with respect to the point that the local source line is cut under the dummy word line DWT2 by the insulating area FIELD formed by STI or the like. With the configuration, a state in which the local source line does not exist under the dummy word lines DWT0 and DWT1 and the memory cell does not function as a memory cell is obtained. Therefore, no memory cell exists under the dummy word lines DWT0 and DWT1. FIG. 1 shows the configuration of the memory block and the configuration of the word decoder of the embodiment. FIG. 16 also shows an equivalent circuit of the memory block in FIG. 1. Although FIG. 17 illustrates that no memory cell is formed under the dummy word lines DWT0 and DWT1 closest to a select transistor in the portion of connection to the data line as an example, by using a layout similar to that of FIG. 17 also for a portion of connection to the common source line, it becomes possible not to form a memory cell under the dummy word lines DWB0 and DWB1 closest to the select transistor. In such a manner, without controlling the dummy word lines DWT0, DWT1, DWB0, and DWB1, no influence is exerted on the main memory. Therefore, the word drivers for controlling the dummy word lines DWT0, DWT1, DWB0, and DWB1 become unnecessary. Therefore, the number of word drivers which have to be disposed in the word decoder WD can be reduced, and the layout area of the word decoder can be reduced. The dummy word lines DWT0, DWT1, DWB0, and DWB1 may be of a floating type. It is sufficient to apply a fixed voltage VL, for example, 0V to the dummy word lines DWT0, DWT1, DWB0, and DWB1.

FIG. 17 illustrates the case where the local source line LBS is cut under the dummy word line DWT2 by the insulating area FIELD formed of STI or the like. The case where the local source line LBS is cut between the dummy word lines DWT1 and DWT0 is similar to the case of FIG. 17.

Although the inverter type has been described as an example of the configuration of the word driver in the embodiment, another configuration such as a configuration using a transfer NMOS may be also used.

Fifth Embodiment

Figure 18:
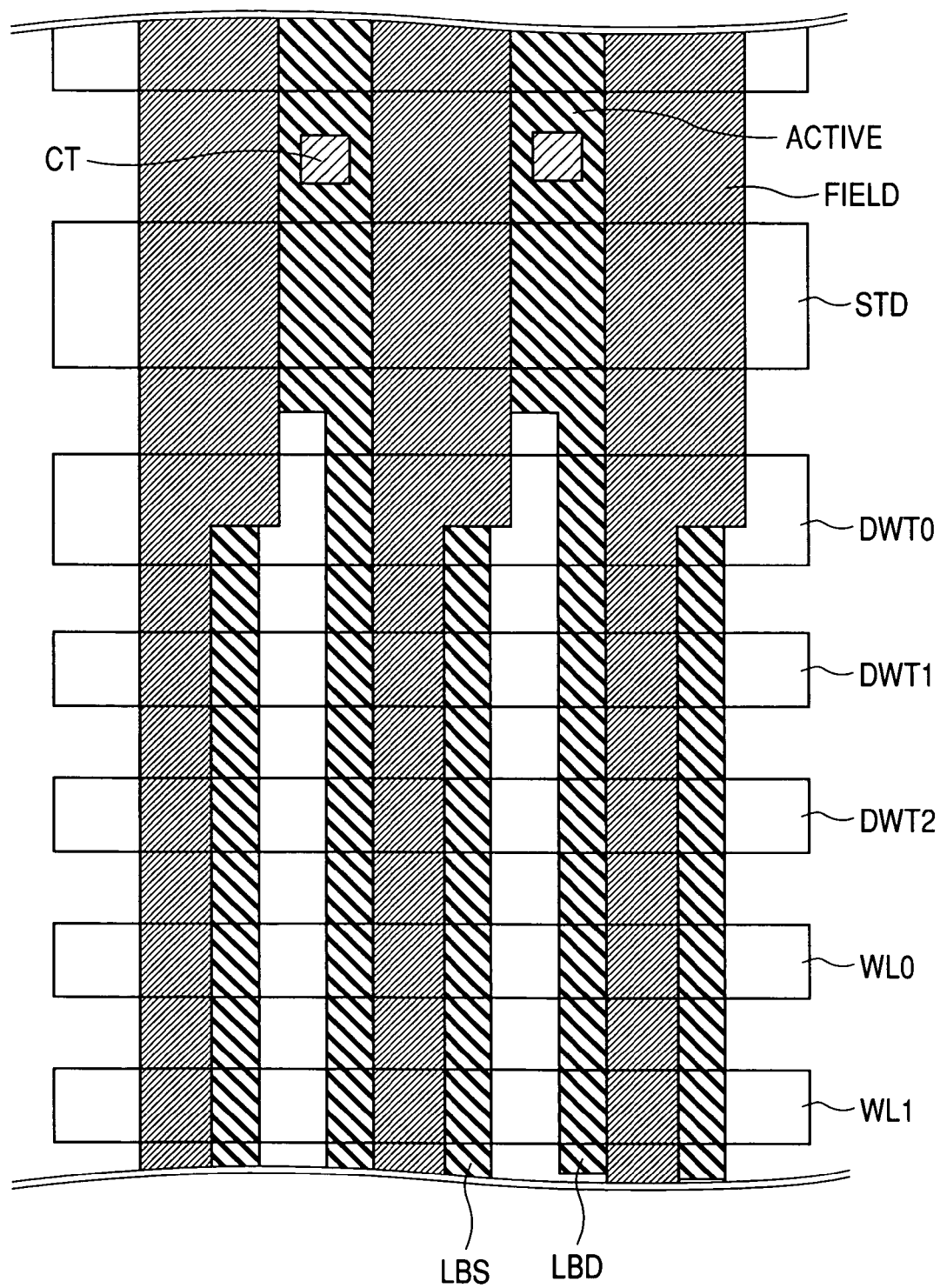
FIG. 18 is a top view of a memory block end in a semiconductor memory device according to a fifth embodiment of the invention.
Figure 19:
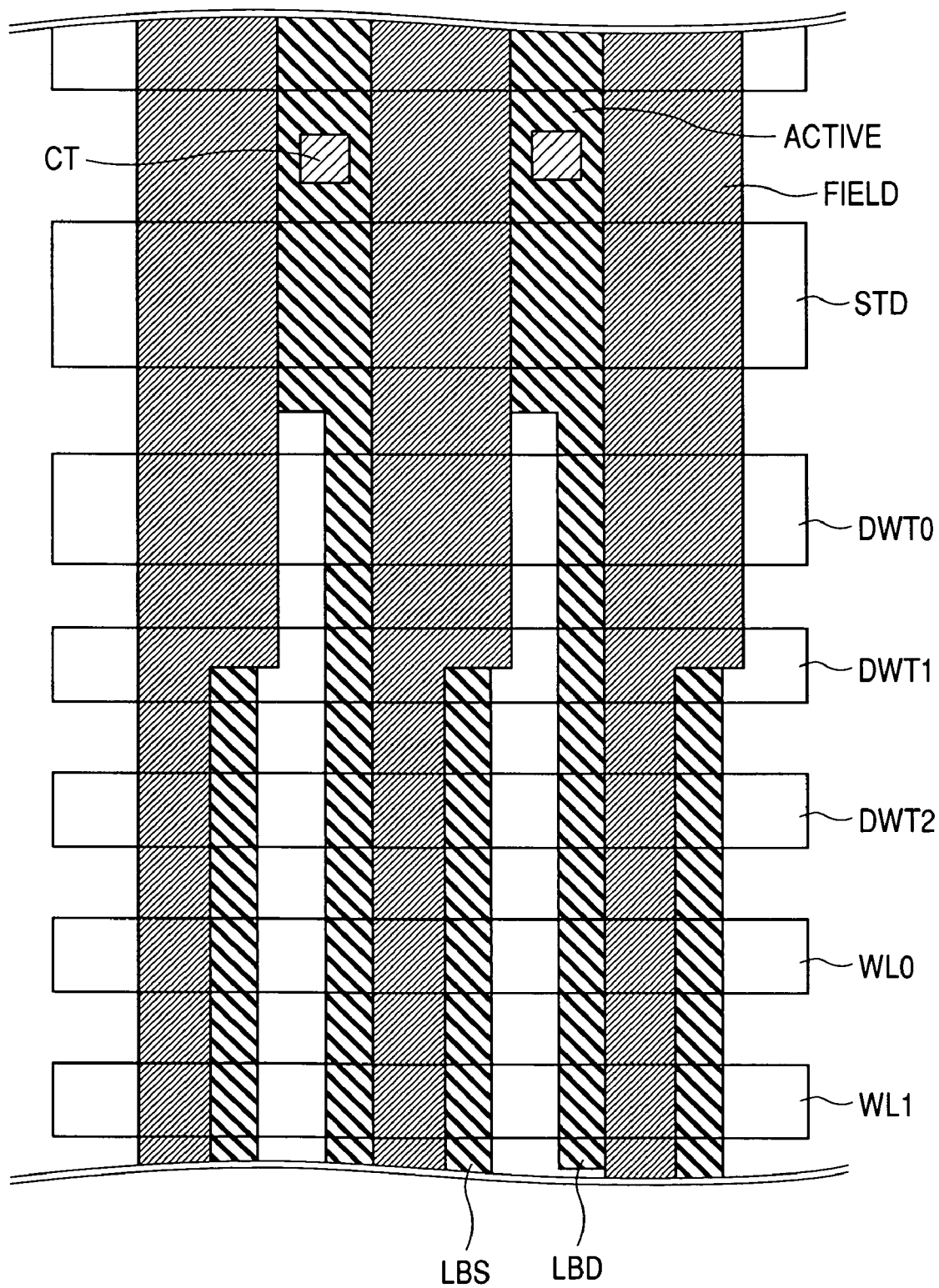
FIG. 19 is a top view of a memory block end in the semiconductor memory device according to the fifth embodiment of the invention, in which the relation between a dummy word line and an isolation region is different from that of FIG. 18.
Figure 20:
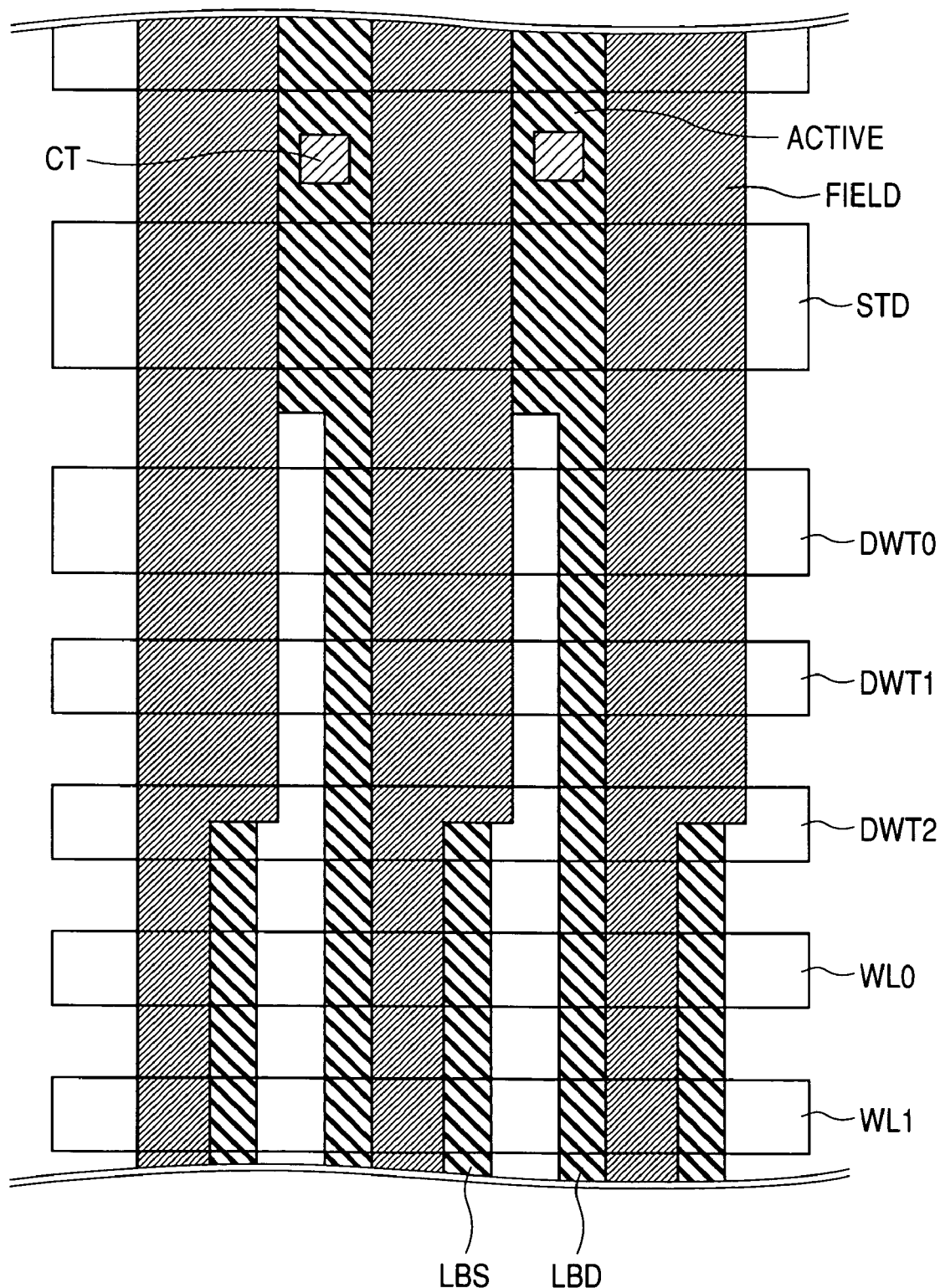
FIG. 20 is a top view of a memory block end in the semiconductor memory device according to the fifth embodiment of the invention, in which the relation between a dummy word line and an isolation region is different from that of FIG. 18 and that of FIG. 19.

A fifth embodiment of the present invention will be described with reference to FIGS. 18 to 20. In FIGS. 6, 13, and 17, the widths of the dummy word lines DWT0 to DWT2 and DWB0 to DWB2 are set to be equal to each other. The fifth embodiment is characterized in that the width of each of the dummy word lines DWT0 and DWB0 positioned outermost in the memory array is set to be larger than that of the other dummy word lines. FIGS. 18, 19, and 20 are top views of a portion of connection to the data line in the fifth embodiment and correspond to FIGS. 6, 13, and 17, respectively. The configuration produces an effect capable of forming the dummy word lines DWT0 and DWB0 more precisely.

Sixth Embodiment

A sixth embodiment of the present invention will be described with reference to FIGS. 21 to 25. The first to sixth embodiments relate to the case where three dummy word lines are disposed on each of both sides of main word lines in a memory block. In the sixth embodiment, the case where two dummy word lines are disposed on each of both sides of the main word lines will be described.

For example, in the case such that a gate line of a select transistor is disposed very close to a word line, there is the possibility that the gate wiring pattern of the select transistor is exerted and, particularly, a word line at an end of a memory block tends to be narrowed due to a change in a development area in the border between rough and fine word line patterns and an optical factor. In such a case, it is unnecessary to dispose three dummy word lines on each of both sides of the memory block. It is preferable to dispose two dummy word lines on each of both sides of the memory block. In the case where a dummy word line pattern closest to the select transistor is broken, the dummy word line is short-circuited with a neighboring dummy word line or the gate line of the select transistor. However, no influence is exerted on the main word lines. Even if two dummy word lines are disposed on each of both sides of the memory block, the same control method as that for the case where three dummy word lines are disposed on each of both sides of the memory block is used. The number of dummy word lines can be decreased, and the number of word drivers for controlling the dummy word lines can be also decreased. Thus, the chip area can are reduced.

Figure 21:
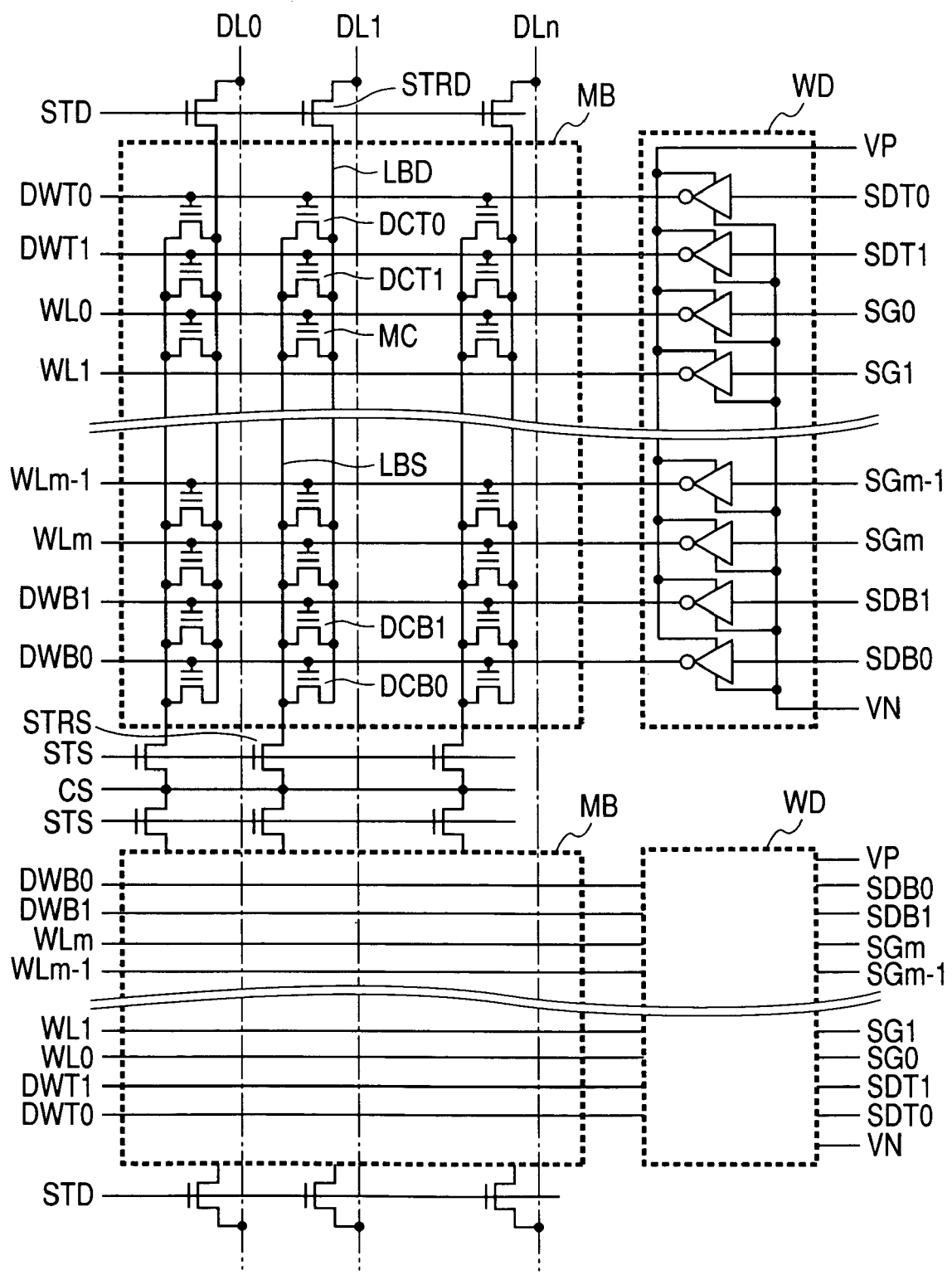
FIG. 21 is a diagram showing the configuration of a memory block and a word decoder in a semiconductor memory device according to a sixth embodiment of the invention.
Figure 22:
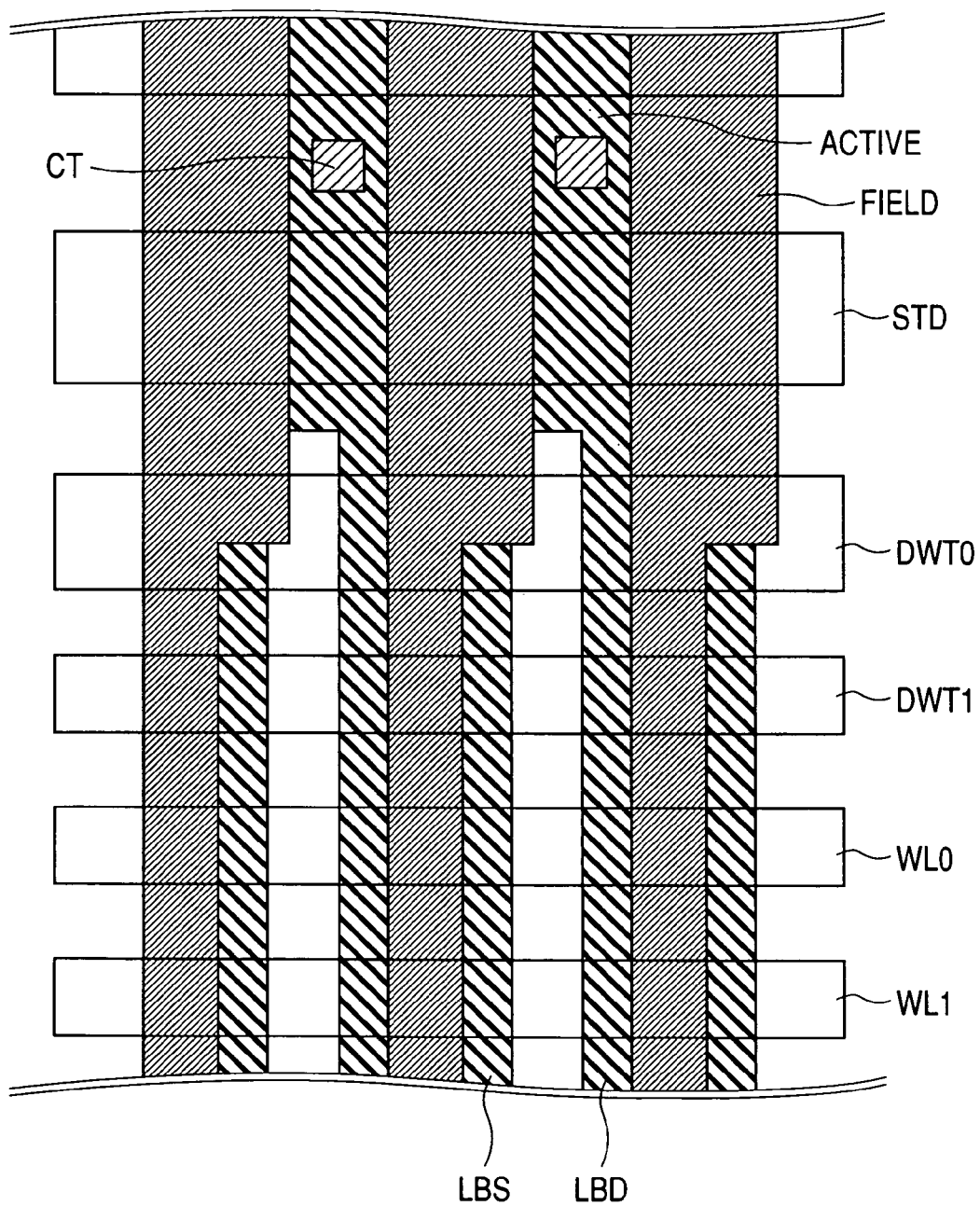
FIG. 22 is a top view of a memory block end in the semiconductor memory device according to the sixth embodiment of the invention.

FIG. 21 shows the configuration of a memory block which takes the form of an AND cell type EEPROM and the configuration of a word decoder. FIG. 22 is a top view of a portion of connection to the data line and corresponds to FIG. 21. As shown in FIG. 22, memory cells are always formed below the dummy word lines DWT0, DWT1, DWB0, and DWB1. Consequently, as shown in FIG. 21, it is characterized that word drivers capable of controlling the dummy word lines DWT0, DWT1, DWB0, and DWB1 are provided.

Figure 23:
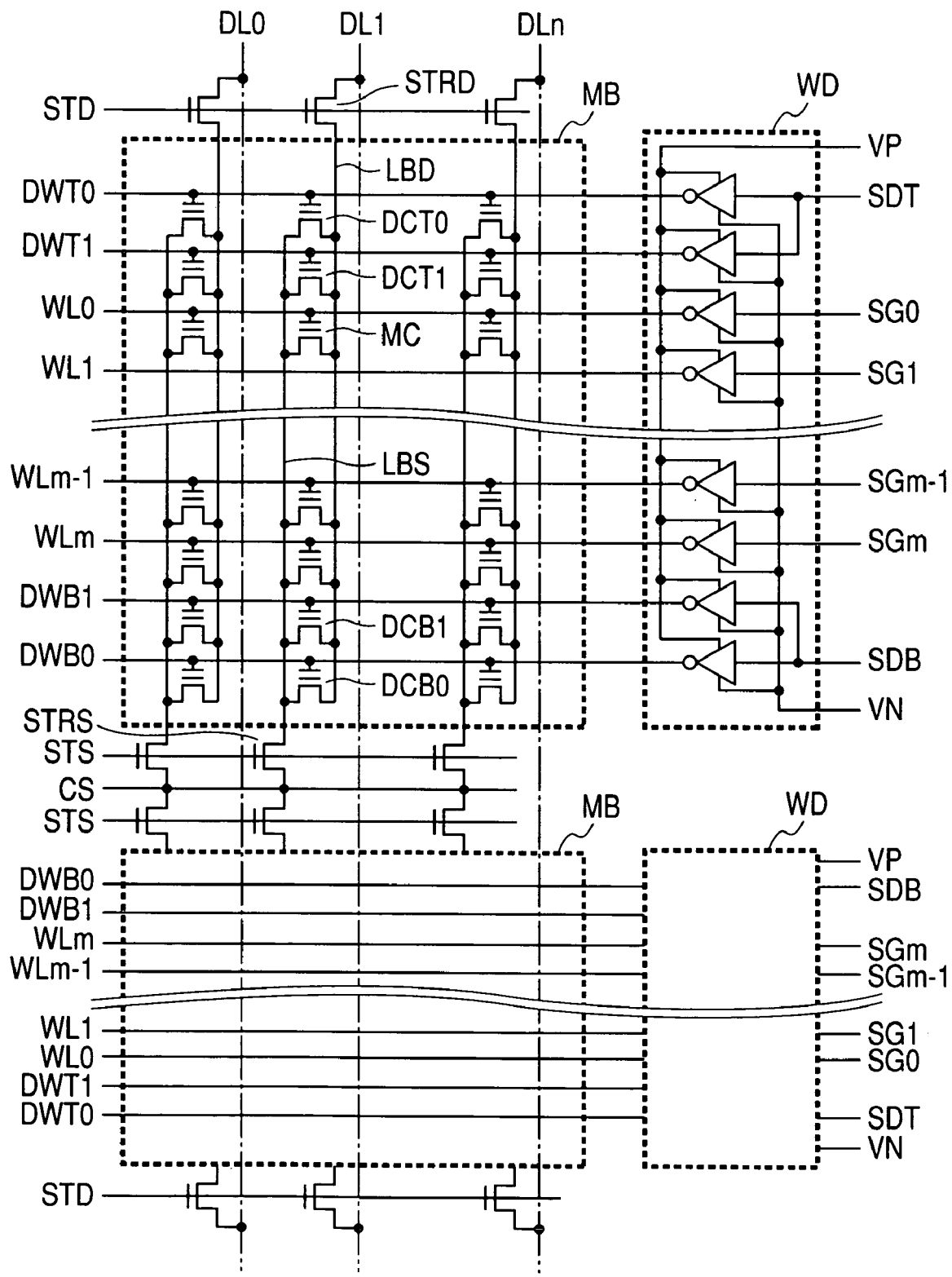
FIG. 23 is a diagram showing the configuration of a memory block and a word decoder in the semiconductor memory device according to the sixth embodiment of the invention, in which the configuration of the word decoder is different from that of FIG. 21.
Figure 24:
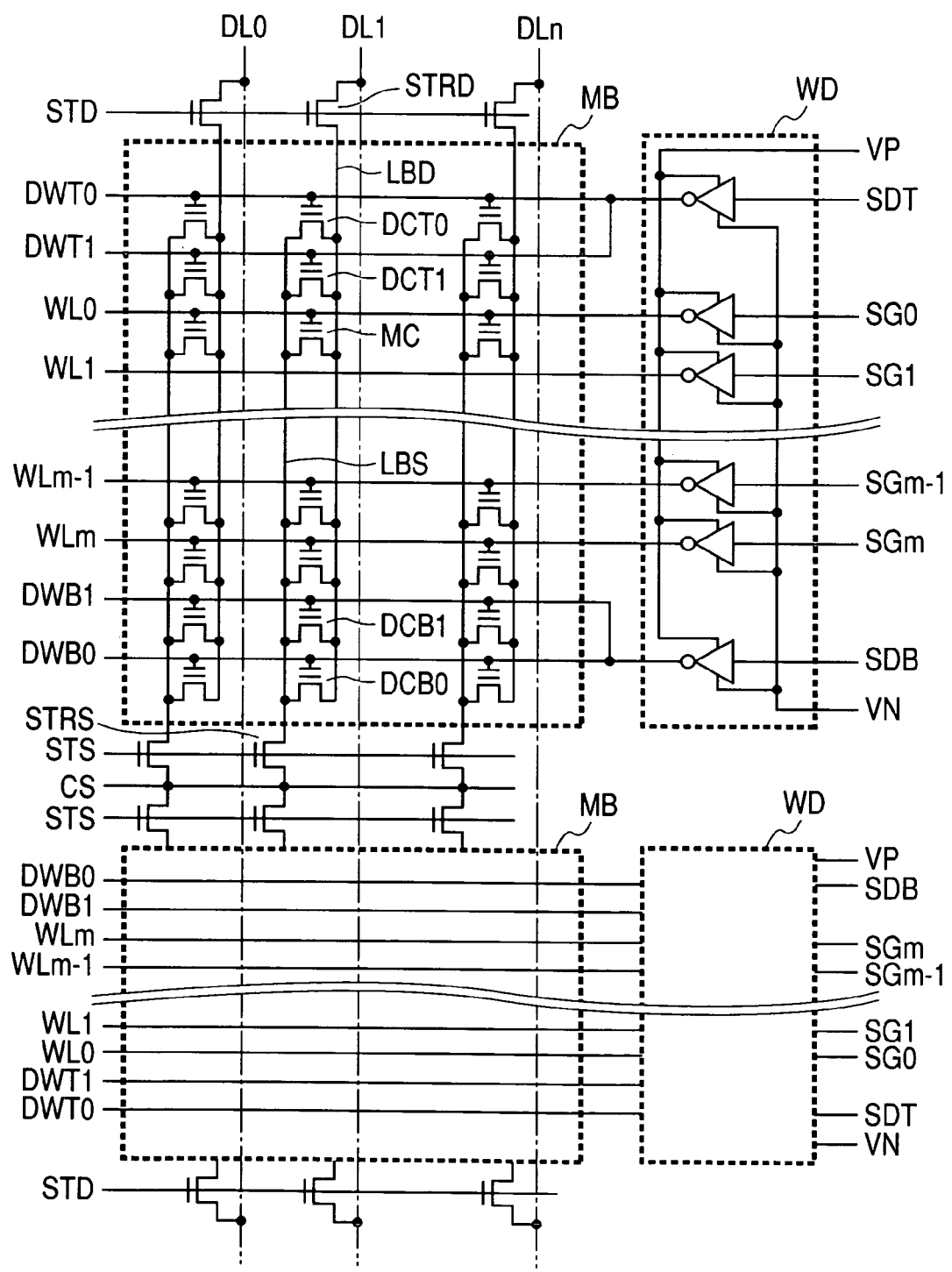
FIG. 24 is a diagram showing the configuration of a memory block and a word decoder in the semiconductor memory device according to the sixth embodiment of the invention, in which the configuration of the word decoder is different from that of FIG. 21 and that of FIG. 23.

As a modification of the embodiment, the word decoder configuration shown in FIG. 23 can be also employed. The configuration of FIG. 23 is characterized in that common signals SDT and SDB are used as the dummy word line selection signals SDT0 and SDT1, and SDB0 and SDB1. With the configuration, the number of signals which have to be controlled by a logic circuit can be reduced, and reduction in the circuit scale and the chip area can be realized. Further, the configuration of FIG. 24 can be also employed. The configuration of FIG. 24 is characterized in that the dummy word lines DWT0 and DWT1 and the dummy word lines DWB0 and DWB1 are driven by a common driver. With the configuration, the number of drivers to be mounted in the word decoder can be decreased, and the chip area can be reduced.

Figure 25:
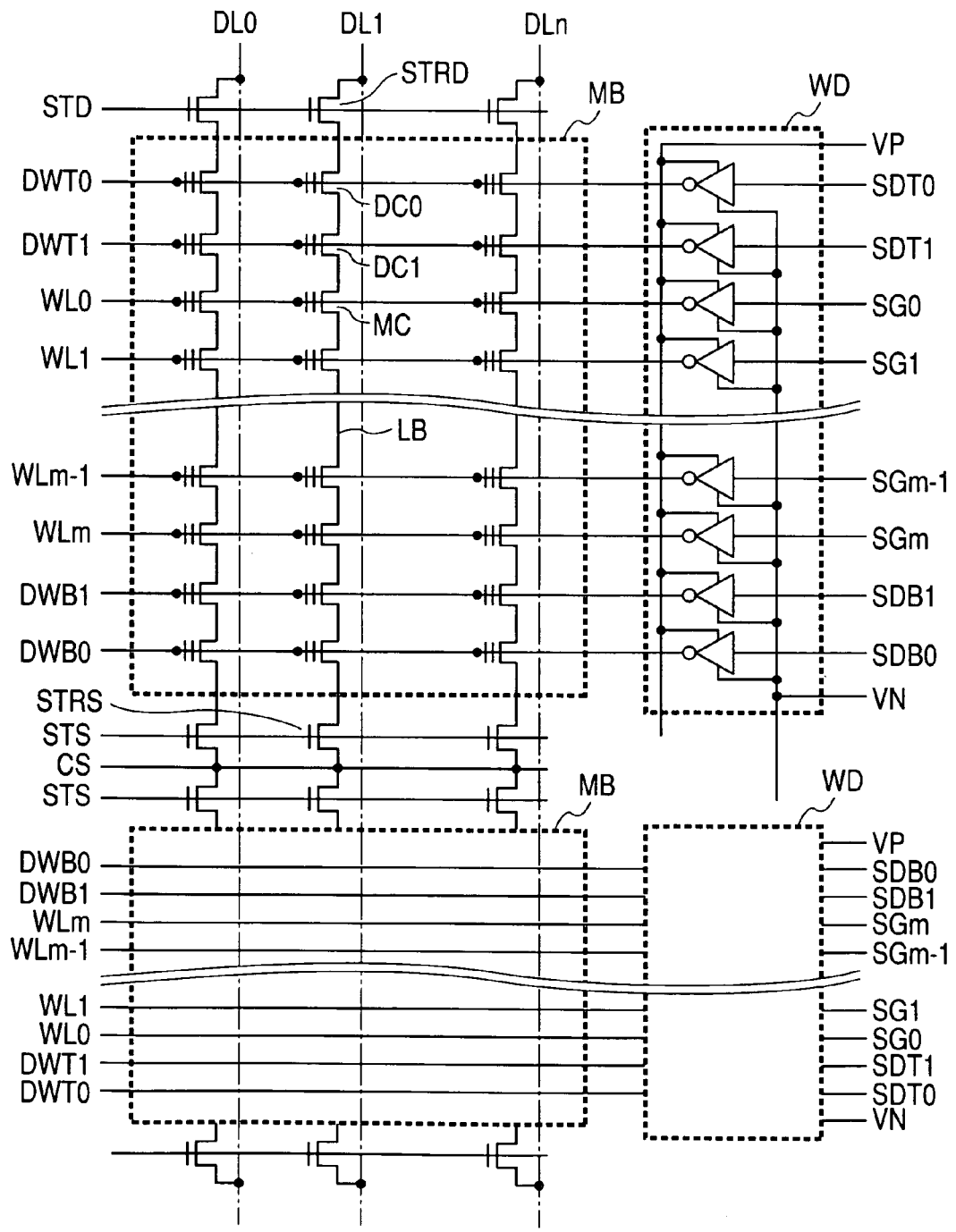
FIG. 25 is a diagram showing the configuration of a memory block and a word decoder in the semiconductor memory device according to the sixth embodiment of the invention, in which a memory cell array constructing a memory block is different from that of FIG. 21.

FIG. 21 shows the memory block of the AND cell type EEPROM. A memory block of the NAND cell type as shown in FIG. 25 produces the same effect.

Although the inverter type has been described as an example of the configuration of the word driver in the embodiment, another configuration such as a configuration using a transfer NMOS may be also used.

Seventh Embodiment

Figure 26:
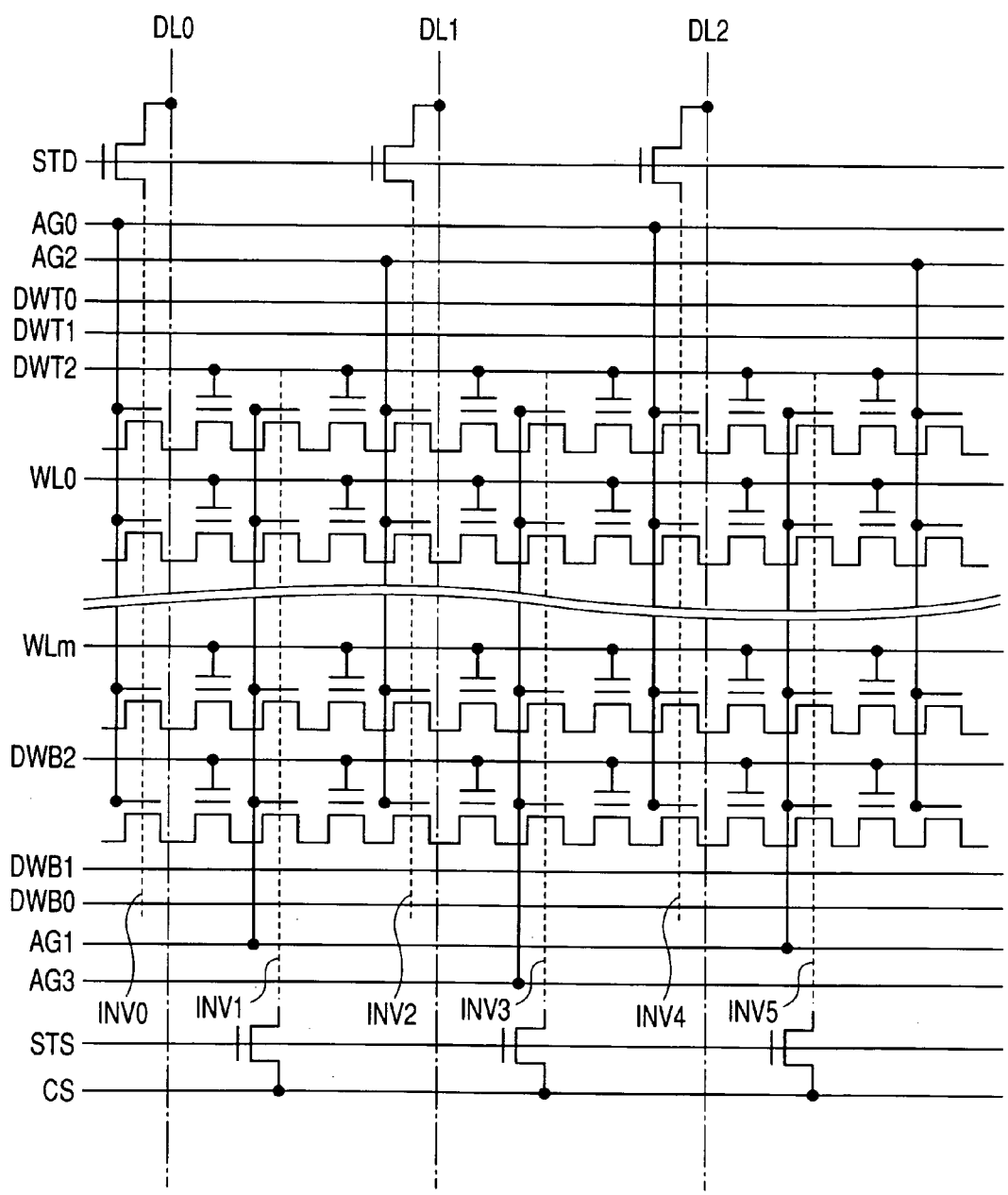
FIG. 26 is a diagram showing the configuration of a memory block in a semiconductor memory device according to a seventh embodiment of the invention.
Figure 27:
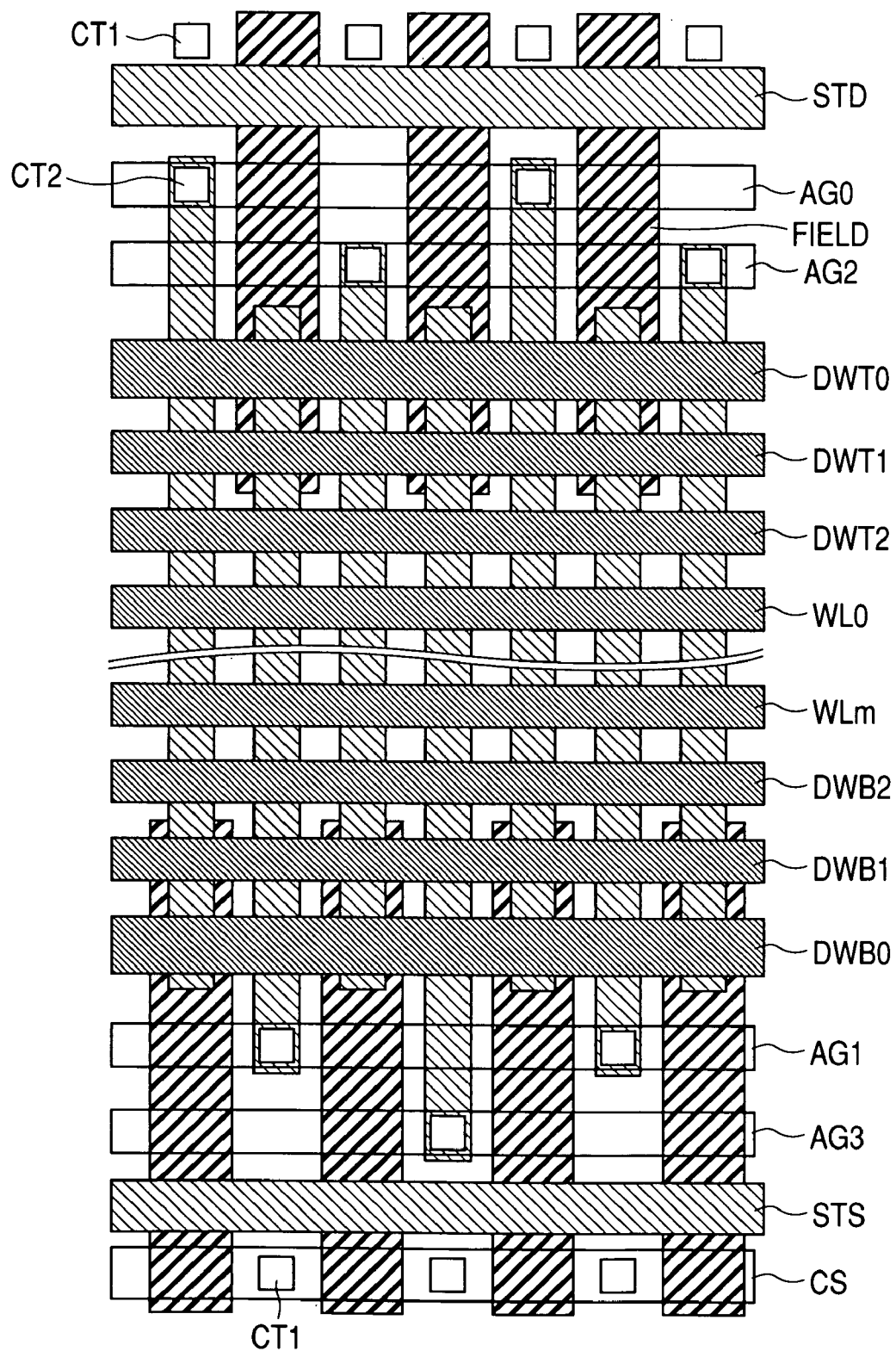
FIG. 27 is a top view of the memory block in the semiconductor memory device according to the seventh embodiment of the invention.

A seventh embodiment of the present invention will be described with reference to FIGS. 26 and 27. In the seventh embodiment, a memory cell array using an inversion layer as a local bit line is applied to the memory block MB of FIG. 1 in the fourth embodiment. FIG. 26 shows an equivalent circuit of the memory cell array using the inversion layer as the local bit line, and FIG. 27 is a top view of the memory array. As shown in FIG. 27, the memory cell array is characterized in that assist gates AG0 to AG3 extend in the direction orthogonal to the word lines, and an inversion layer formed in an Si substrate just below a gate when a positive voltage is applied to the assist gates AG0 to AG3 is used as a local bit line. Also in the memory cell array, by disposing the dummy word lines DWT0 to DWT2 and the dummy word lines DWB0 to DWB2 on the outer sides of the main word lines WL0 to WLm, the main word lines can be patterned with high precision.

As shown in FIG. 27, for example, in a portion of connection to a data line, the insulating area FIELD formed by STI or the like extends to the portion between the dummy word lines DWT1 and DWT2 just below the assist gates AG1 and AG3. It is therefore set so that no local bit line is formed in the area where the dummy word lines DWT0 and DWT1 and the assist gates AG1 and AG3 cross each other. Similarly, in a portion of connection to a data line, the insulating area FIELD formed by STI or the like extends to the portion between the dummy word lines DWB1 and DWB2 just below the assist gates AG0 and AG2. It is therefore set so that no local bit line is formed in the area where the dummy word lines DWB0 and DWB1 and the assist gates AG0 and AG2 cross each other. Thus, it can be set so that no memory cells are formed just below the dummy word lines DWT0, DWT1, DWB0, and DWB1. Therefore, in a manner similar to the example of the AND cell type EEPROM in the fourth embodiment, a fixed potential VL, for example, 0V is applied to the dummy word lines DWT0 and DWT1 and the dummy word lines DWB0 and DWB1, and the word drivers are mounted for the dummy word lines DWT2 and DWB2, so that the threshold voltage state of dummy memory cells formed just below the dummy word lines can be controlled. As a method of controlling the threshold voltage of the dummy memory cells, source-side-injection programming used for programming the main memory cells or a method of applying a positive high voltage such as 18V to a word line and injecting electrons to a floating gate by Fowler-Nordheim tunneling current may be employed. Particularly, when the latter method is used, even if the floating gates in the other memory cells or dummy memory cells are largely positively charged, electrons can be injected into a target floating gate with reliability.

Eighth Embodiment

Figure 28:
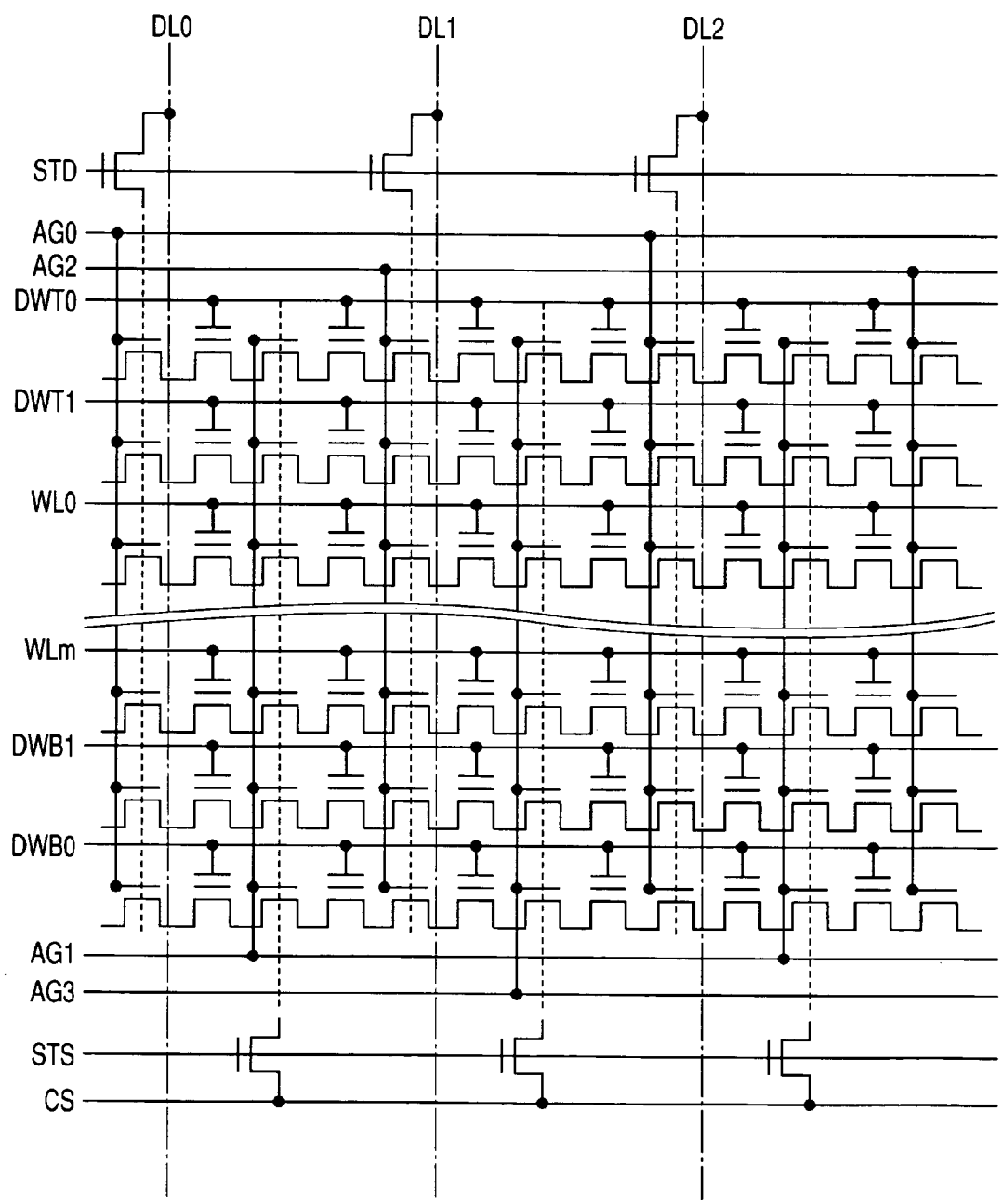
FIG. 28 is a diagram showing the configuration of a memory block in a semiconductor memory device according to an eighth embodiment of the invention.

An eighth embodiment of the present invention will be described with reference to FIGS. 28 and 29. In the eighth embodiment, a memory cell array using an inversion layer as a local bit line is applied to the memory block MB of FIG. 21 in the sixth embodiment. FIG. 28 shows an equivalent circuit of the memory cell array using the inversion layer as the local bit line, and FIG. 29 is a top view of the memory array.

Figure 29:
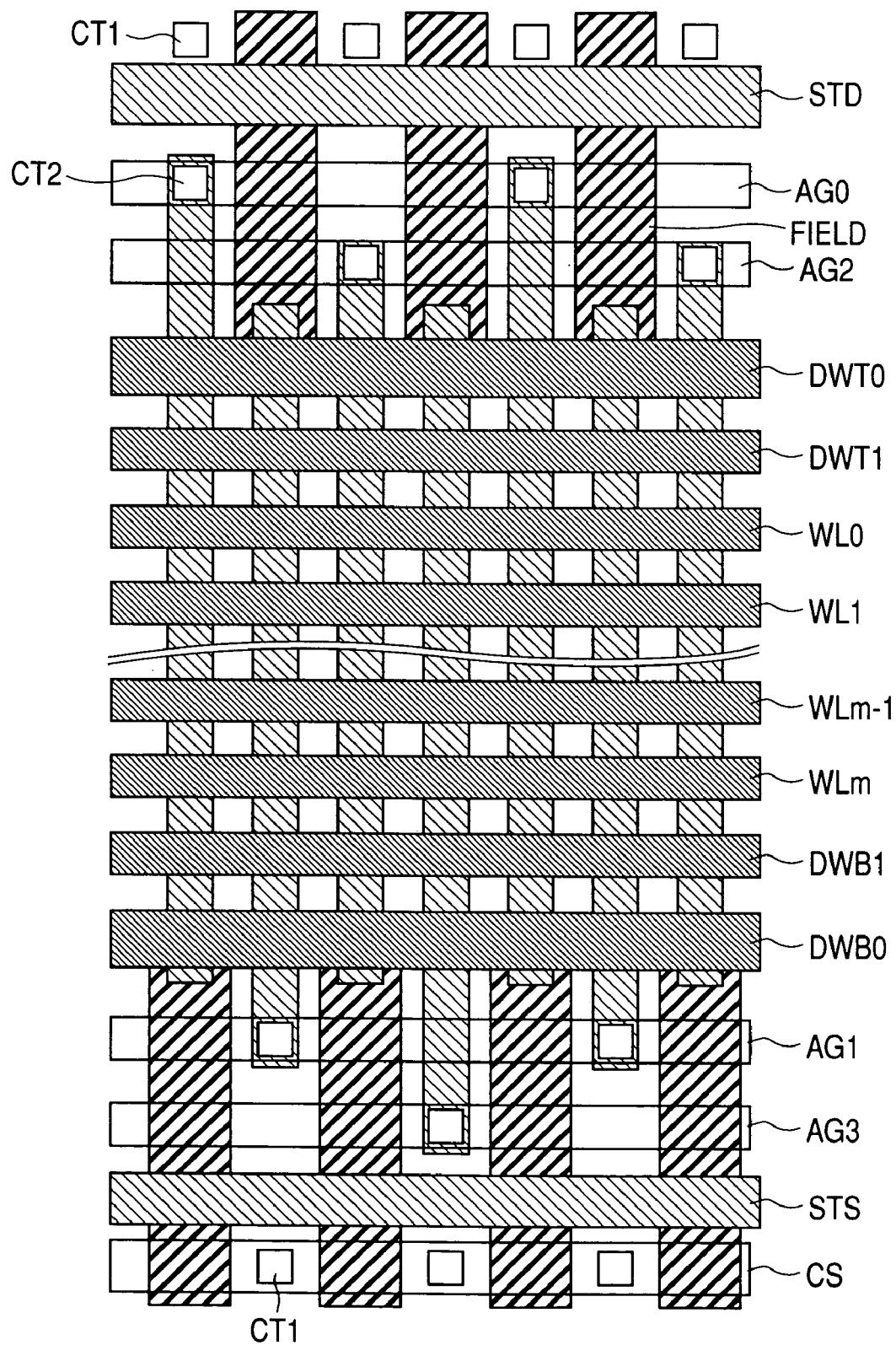
FIG. 29 is a top view of a memory block in the semiconductor memory device according to the eighth embodiment of the invention.

As shown in FIG. 29, the memory cell array is characterized in that the assist gates AG0 to AG3 extend in the direction orthogonal to the word lines, and an inversion layer formed in an Si substrate just below a gate when a positive voltage is applied to the assist gates AG0 to AG3 is used as a local bit line. Also in such a memory cell array, by disposing the dummy word lines DWT0 and DWT1 and the dummy word lines DWB0 and DWB1 on the outer sides of the main word lines WL0 to WLm, the main word lines can be patterned with high precision.

As shown in FIG. 29, for example, in a portion of connection to a data line, the insulating area FIELD formed by STI or the like extends to a position under the dummy word line DWT0 just below the assist gates AG1 and AG3. Similarly, the insulating area FIELD formed by STI or the like extends to a position under the dummy word line DWB0 just below the assist gates AG0 and AG2. With the configuration, dummy memory cells are formed below the dummy word lines DWT0 and DWT1 and the dummy word lines DWB0 and DWB1. Therefore, in a manner similar to the AND cell type EEPROM in the sixth embodiment, a word driver is mounted for each of the dummy word lines DWT0 and DWT1 and the dummy word lines DWB0 and DWB1 so that the threshold voltage state of the dummy memory cell formed just below each of the dummy word lines can be controlled. As a method of controlling the threshold voltage of the dummy memory cells, source-side-injection programming used for programming the main memory cells or a method of applying a positive high voltage such as 18V only to a word line and injecting electrons to a floating gate by Fowler-Nordheim tunneling current may be employed. Particularly, when the latter method is used, even if the floating gates in the other memory cells or dummy memory cells are largely positively charged, electrons can be injected into a target floating gate with reliability.

The memory cell array of the eighth embodiment may be applied to the memory block MB in the FIG. 23 or 24 in the sixth embodiment.

Figure 30:
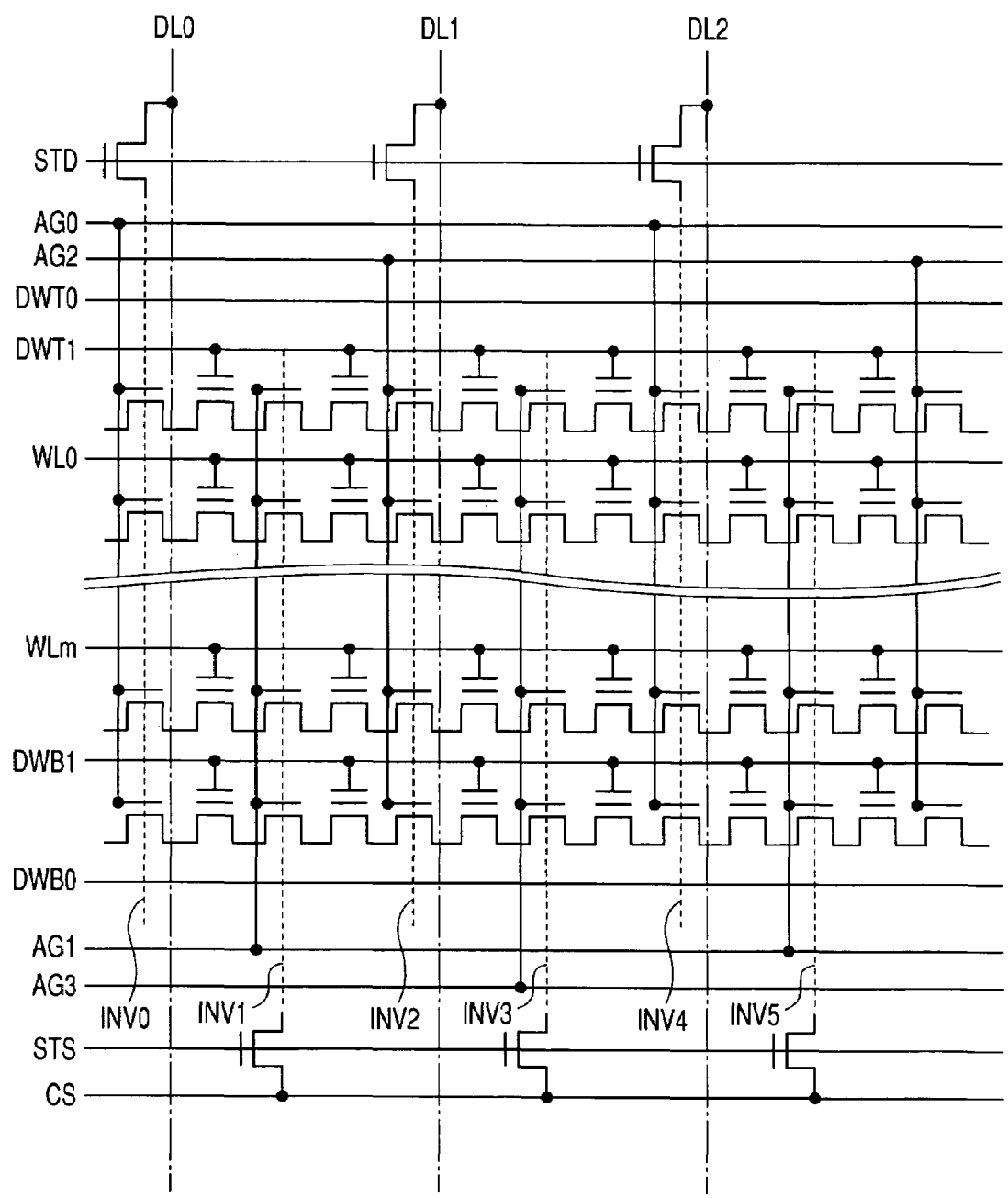
FIG. 30 is a diagram showing the configuration of the memory block in the semiconductor memory device according to the eighth embodiment of the invention, which is different from that of FIG. 28.
Figure 31:
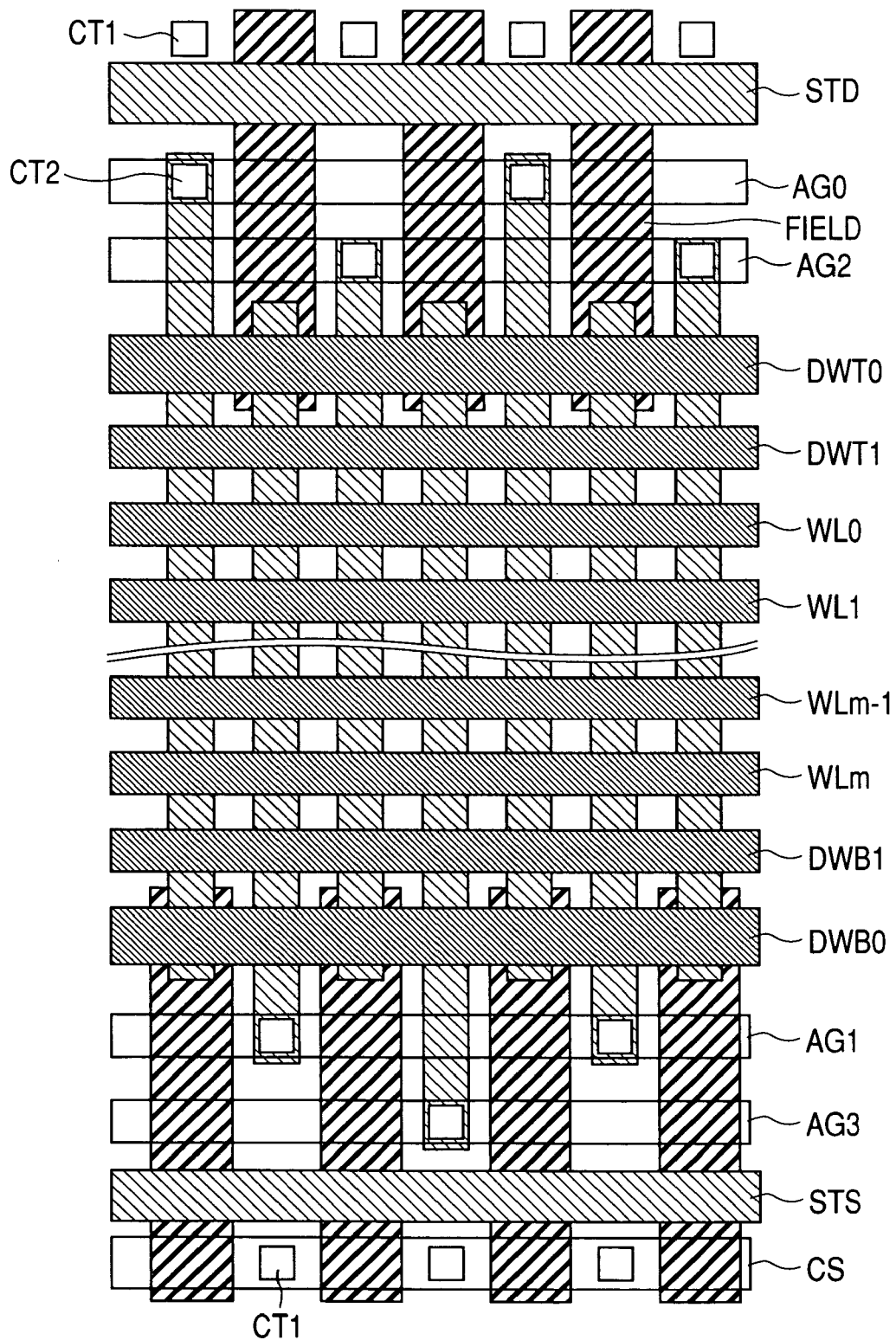
FIG. 31 is a top view of a memory block in the semiconductor memory device according to the eighth embodiment of the invention, in which the relation between a dummy word line and an isolation region is different from that of FIG. 29.

Further, as shown in FIGS. 30 and 31, another layout may be also employed in which, for example, in a portion of connection to a data line, the insulating area FIELD formed by STI or the like extends to a position between the dummy word lines DWT0 and DWT1 just below the assist gates AG1 and AG3 and no dummy memory cells are formed below the dummy word line DWT0. Similarly, another layout may be also employed in which the insulating area FIELD formed by STI or the like extends to a position between the dummy word lines DWB0 and DWB1 just below the assist gates AG0 and AG2 and no dummy memory cells are formed below the dummy word line DWB0. With the configuration, it becomes unnecessary to provide word drivers for the dummy word lines DWT0 and DWB0 and the layout area of the word decoder can be reduced.

The present invention can be used for a nonvolatile semiconductor memory device.

What is claimed is:

1. A semiconductor memory device comprising:
    a memory block in which memory cell units obtained by connecting plural memory cells are arranged in an array;
    select transistors provided at a first side and a second side of the memory cell units;
    three dummy word lines provided between the plural memory cells and the select transistor which is provided at the first side of the memory cell units and another three dummy word lines provided between the plural memory cells and the select transistor which is provided at the second side of the memory cell units; and
    a word driver for controlling dummy word line potential of at least one of the dummy word lines.

2. The semiconductor memory device according to claim 1, wherein the word driver for controlling the dummy word line potential of at least one of the dummy word lines is disposed in a word decoder.

3. The semiconductor memory device according to claim 1, wherein a control signal of a word driver for controlling the dummy word line potential is commonly used as a control signal of a word driver for controlling another dummy word line potential.

4. The semiconductor memory device according to claim 1, wherein a word driver for controlling the dummy word line potential simultaneously controls another dummy word line potential.

5. The semiconductor memory device according to claim 1, wherein a word driver for controlling the dummy word line potential has the same configuration as that of a word driver for controlling a word line of a data storage area.

6. The semiconductor memory device according to claim 1, wherein width of a dummy word line disposed on the outermost side of the memory cell unit is set to be wider than that of other dummy word lines.

7. The semiconductor memory device according to claim 1, wherein in the memory cell unit, plural nonvolatile memory cells are connected in parallel.

8. The semiconductor memory device according to claim 1, wherein the memory cell uses an inversion layer as a bit line in the memory cell unit.

9. The semiconductor memory device according to claim 7, further comprising means which controls a threshold voltage so that a dummy memory cell formed just below each of the dummy word lines becomes nonconductive.

10. The semiconductor memory device according to claim 1, wherein the memory cell unit is an NAND type EEPROM in which plural nonvolatile memory cells are connected in series.

11. The semiconductor memory device according to claim 10, further comprising means which controls a threshold voltage so that a dummy memory cell formed just below each of the dummy word lines becomes conductive.

12. A semiconductor memory device comprising: a memory block in which memory cell units obtained by connecting plural memory cells are arranged in an array; two dummy word lines adjacent to a select transistor at each of both ends of the memory cell unit in a memory cell array constructed by disposing plural memory blocks; and a word driver for controlling at least one dummy word line potential in the dummy word lines, the word driver being provided in a word decoder.

13. The semiconductor memory device according to claim 12, wherein a control signal of a word driver for controlling the dummy word line potential is commonly used as a control signal of a word driver for controlling another dummy word line potential.

14. The semiconductor memory device according to claim 12, wherein a word driver for controlling the dummy word line potential simultaneously controls another dummy word line potential.

15. The semiconductor memory device according to claim 12, wherein a word driver for controlling the dummy word line potential has the same configuration as that of a word driver for controlling a word line of a data storage area.

16. The semiconductor memory device according to claim 12, wherein width of a dummy word line disposed on the outermost side of the memory cell unit is set to be wider than that of other dummy word lines.

17. The semiconductor memory device according to claim 12, wherein in the memory cell unit, plural nonvolatile memory cells are connected in parallel.

18. The semiconductor memory device according to claim 12, wherein the memory cell uses an inversion layer as a bit line in the memory cell unit.

19. The semiconductor memory device according to claim 17, further comprising means which controls a threshold voltage so that a dummy memory cell formed just below the dummy word line becomes nonconductive.

20. The semiconductor memory device according to claim 12, wherein the memory cell unit is an NAND type EEPROM in which plural nonvolatile memory cells are connected in series.

21. The semiconductor memory device according to claim 20, further comprising means which controls a threshold voltage so that a dummy memory cell formed just below the dummy word line becomes conductive.

* * * * *